(12) United States Patent
Shimoida et al.

(10) Patent No.: US 7,042,086 B2
(45) Date of Patent: May 9, 2006

(54) STACKED SEMICONDUCTOR MODULE AND ASSEMBLING METHOD OF THE SAME

(75) Inventors: Yoshio Shimoida, Yokosuka (JP); Toshiro Shinohara, Yokosuka (JP); Tetsuya Hayashi, Yokosuka (JP); Masanori Yamagiwa, Yokohama (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/678,208

(22) Filed: Oct. 6, 2003

(65) Prior Publication Data

US 2004/0089934 A1 May 13, 2004

(30) Foreign Application Priority Data

Oct. 16, 2002 (JP) .......................... P 2002-301565
Jun. 3, 2003 (JP) .......................... P 2003-157857

(51) Int. Cl.
*H01L 23/34* (2006.01)

(52) U.S. Cl. ...................... 257/724; 257/723; 257/726; 257/727

(58) Field of Classification Search ................ 257/686, 257/692, 723, 724, 726, 727
See application file for complete search history.

(56) References Cited

U.S. PATENT DOCUMENTS

| 5,891,761 A | 4/1999 | Vindasius et al. |
| 2001/0052641 A1 | 12/2001 | Kuo et al. |
| 2002/0024129 A1* | 2/2002 | Hirahara et al. ............ 257/691 |

FOREIGN PATENT DOCUMENTS

| EP | 1 172 850 A2 | 1/2002 |
| JP | P2001-298152 A | 10/2001 |

* cited by examiner

*Primary Examiner*—Ngân V. Ngô
(74) *Attorney, Agent, or Firm*—McDermott Will & Emery LLP

(57) ABSTRACT

A stacked semiconductor module encompasses (a) a upper switching element having a first semiconductor chip, a first top electrode disposed at a top surface of the first semiconductor chip, a first bottom electrode disposed at a bottom surface of the first semiconductor chip, and a first control electrode configured to control conduction between the first top and first bottom electrodes; (b) a first wiring plate disposed beneath the upper switching element, electrically connected to the first bottom electrode; and (c) a lower switching element disposed beneath the wiring plate, having a second semiconductor chip, a second top electrode disposed at a top surface of the second semiconductor chip, electrically connected to the first wiring plate, a second bottom electrode disposed at a bottom surface of the second semiconductor chip, and a second control electrode configured to control conduction between the second top and second bottom electrodes.

17 Claims, 28 Drawing Sheets

STACKED SEMICONDUCTOR MODULE AND ASSEMBLING METHOD OF THE SAME

BACKGROUND OF THE INVENTION

1. Field of the Invention

The present invention relates to a stacked semiconductor module in which plural semiconductor elements are stacked, and an assembling method for the stacked semiconductor module.

2. Description of the Related Art

Japanese Patent Laid-Open No. 2001-298152 teaches a disk-cell type stacked semiconductor module encompassing a first power distribution board (an emitter press contact electrode) electrically connected to plural top electrodes of respective semiconductor elements and a second power distribution board (a collector press contact electrode) electrically connected to corresponding bottom electrodes. Plural semiconductor elements are stack-pressed in the stacked semiconductor module. A control signal distribution board made of MCM substrate is installed in the inside of the stacked semiconductor module, and the control signal distribution paths are arranged in the space between plural semiconductor elements.

SUMMARY OF THE INVENTION

However, in the stacked semiconductor module disclosed in Japanese Patent Laid-Open No. 2001-298152, because the first power distribution board is connected to the plural switching elements at the surface of the plural switching elements by arranging the switching elements in parallel on a single plane, there was a problem in that the whole package size of stacked semiconductor module became large. On the other surface of the plural switching elements, an auxiliary electrode made by an aluminum wire having a thermal expansion coefficient different from that of the switching element is installed so as to be connected to the switching element. Through the auxiliary electrode disposed neighborhood of the switching elements, or using the aluminum wire the second common electrode is connected. Owing to this configuration, in addition to the problem that parasitic inductance is large, there is a problem in that the lateral geometry becomes large by including the auxiliary electrode. Furthermore, due to the repeating variation of the temperature cycle between high and low temperatures, there was a problem in that the aluminum wire peels off from the surface of the switching element or at the electrode surface of the switching element. Furthermore, because there are many constituent components owing to the above configuration, the number of assembling processeses increases, and there was a problem of raised assembling costs and reduced assembling yields.

In view of these circumstances, it is an object of the present invention to provide a stacked semiconductor module facilitating miniaturization and an assembly method for the stacked semiconductor module.

Another object of the present invention is to provide a stacked semiconductor module in which inductance between the semiconductor elements and the wiring layer is reduced, and the area of planer orientation is reduced, the semiconductor elements may include switching elements and diodes.

To achieve the above-mentioned objects, a feature of the present invention inheres in a stacked semiconductor module encompassing: (a) a first upper switching element having a first semiconductor chip, a first top electrode disposed at a top surface of the first semiconductor chip, a first bottom electrode disposed at a bottom surface of the first semiconductor chip, and a first control electrode configured to control conduction between the first top and first bottom electrodes; (b) a first wiring plate disposed beneath the first upper switching element, electrically connected to the first bottom electrode; and (c) a first lower switching element disposed beneath the wiring plate, having a second semiconductor chip, a second top electrode disposed at a top surface of the second semiconductor chip, electrically connected to the first wiring plate, a second bottom electrode disposed at a bottom surface of the second semiconductor chip, and a second control electrode configured to control conduction between the second top and second bottom electrodes.

Another feature of the present invention inheres in a method for assembling a stacked semiconductor module, encompassing following steps:

(a) forming a lower insulation layer having a window on a second power distribution plate;

(b) mounting a lower switching element on the second power distribution plate aligned by the window of the lower insulation layer;

(c) stacking a wiring plate on the lower switching element;

(d) forming an upper insulation having a window on the wiring plate;

(e) mounting an upper switching element on the wiring plate aligned by the window of the upper insulation layer;

(f) stacking a first power distribution plate on the upper switching element.

Still another feature of the present invention inheres in a stacked semiconductor module encompassing: (a) an upper switching means for controlling conduction between first top and first bottom electrodes; (b) a lower switching means for controlling conduction between second top and second bottom electrodes; (c) a wiring means for electrically connecting both to the first bottom electrode and second top electrode; and (d) a means for press-contact vertically a laminated structure encompassing the upper switching means, the lower switching means and the wiring means.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of stacked semiconductor modules, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Prepositions, such as "on", "over", "under", "beneath", and "normal" are defined with respect to a planar surface of the substrate, regardless of the orientation in which the substrate is actually held. A layer is on another layer even if there are intervening layers.

FIRST EMBODIMENT

Figure 1:
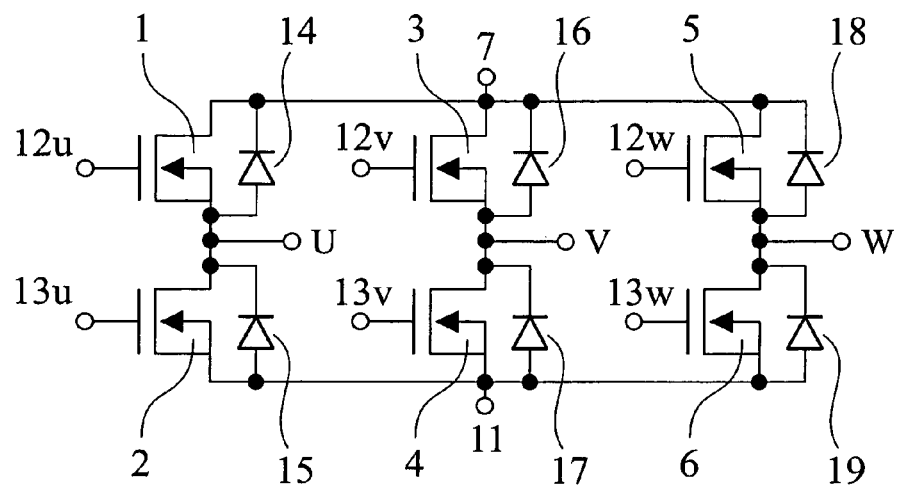
FIG. 1 is a circuit diagram associated with the stacked semiconductor module according to the first embodiment, showing a circuit configuration of a three-phase inverter.

FIG. 1 shows a circuit configuration of a so-called "three-phase inverter". A series circuit of a first switching element 1 and a second switching element 2 implement a first leg-circuit, a series circuit of a third switching element 3 and a fourth switching element 4 implement a second leg-circuit, and a series circuit of a fifth switching element 5 and a six switching element 6 implement a third leg-circuit.

The first switching element 1 and the first diode 14 connected in parallel correspond to the upper arm of the U-phase, the second switching element 2 and the second diode 15 connected in parallel correspond to the lower arm of the U-phase; the third switching element 3 and the third diode 16 connected in parallel correspond to the upper arm of the V-phase, the fourth switching element 4 and the fourth diode 17 connected in parallel correspond to the lower arm of the V-phase; and the fifth switching element 5 and the fifth diode 18 connected in parallel correspond to the upper arm of the W-phase, the sixth switching element 6 and the sixth diode 19 connected in parallel correspond to the lower arm of the W-phase. The first to sixth diodes 14 and 19 serve as free-wheeling diodes respectively. Here, "the upper arm" and "the lower arm" is defined against electrical potentials. Therefore, the first, third and fifth switching elements 1, 3 and 5 are called as "upper switching elements" and the second, fourth and sixth switching elements 2, 4 and 6 are called as "lower switching elements". That is, the first, third and fifth switching elements 1, 3 and 5 are the first, second and third upper switching elements, and the second, fourth and sixth switching elements 2, 4 and 6 are the first, second and third lower switching elements, respectively.

Figure 2:
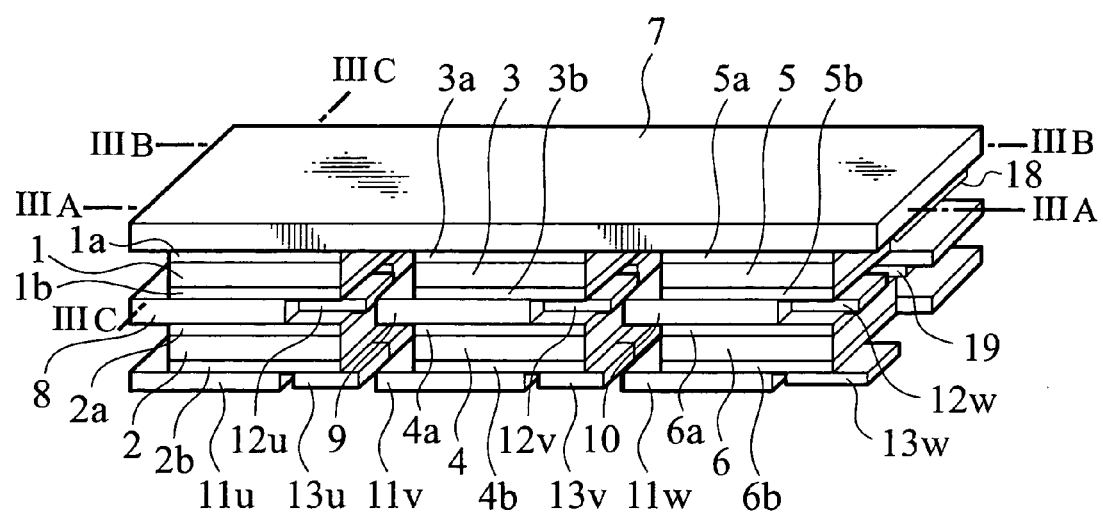
FIG. 2 is a perspective view of the stacked semiconductor module associated with the first embodiment.

FIG. 2 is a perspective view of the stacked semiconductor module associated with the first embodiment. Each of three switching elements represented at the near side of the stacked semiconductor module encompasses a bottom electrode and a control electrode at a bottom surface and a top electrode at the top surface. Here, the "top electrode" is one of the emitter and collector electrodes of a bipolar junction transistor (BJT) or an insulated gate bipolar transistor (IGBT), one of the anode and cathode electrodes of a thyristor such as a gate-turn-off thyristor (GTO) or a static induction (SI) thyristor, or one of the source and drain electrodes of an insulated gate transistor (IGT) such as a MOSFET and a MOS static induction transistor (SIT). The "bottom electrode" is the other of the emitter and collector electrodes, the other of the anode and cathode electrodes, or the other of the source and drain electrodes. For example, if the top electrode is the emitter electrode, the bottom electrode is the collector electrode, if the top electrode is the anode electrode, the bottom electrode is the cathode electrode, and if the top electrode is the source electrode, the bottom electrode is the drain electrode. Between the top and bottom electrodes, a main current controlled by a control electrode flows so as to form a current path between the top and bottom electrodes. Generally, switching elements are symmetrical, and therefore, the source and drain electrodes thereof are replaceable with each other. For example, in the MOSFET, the source and drain electrodes are only a matter of naming. As will be appreciated, the terms drain and source can be exchanged without modifying the structure itself.

Figure 3A:
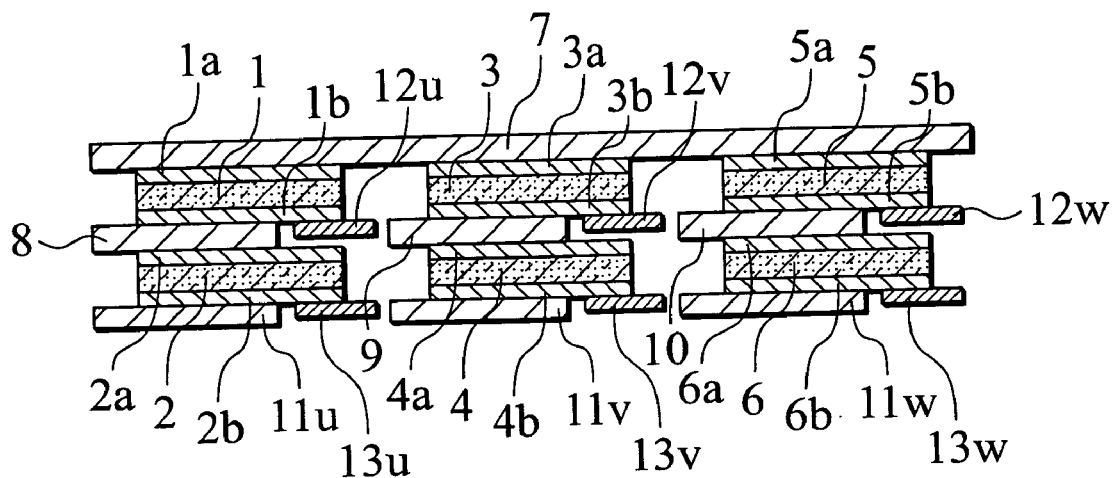
FIG. 3A is a cross-sectional view showing the configuration of the stacked semiconductor module taken on line $III_A$—$III_A$ in FIG. 2.
Figure 3B:
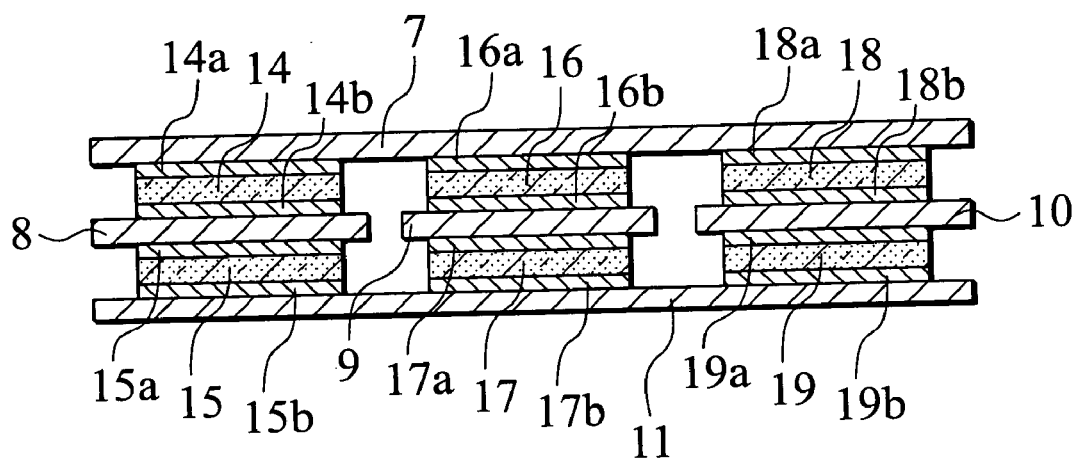
FIG. 3B is a cross-sectional view showing the configuration of the stacked semiconductor module taken on line $III_B$—$III_B$ in FIG. 2.
Figure 3C:
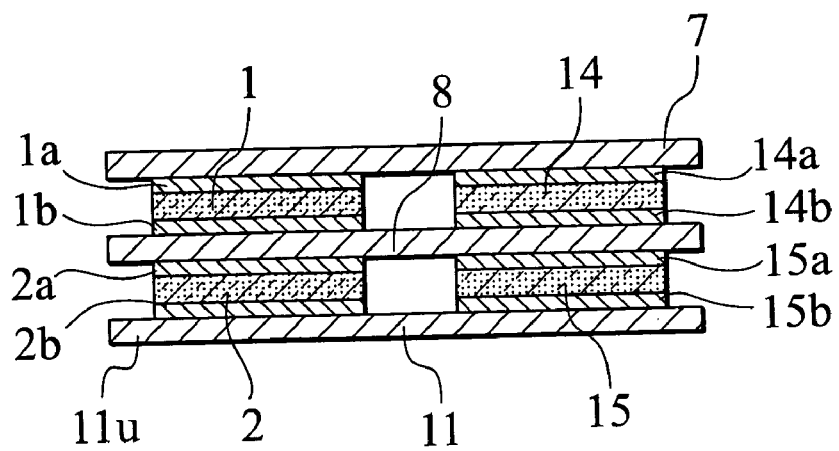
FIG. 3C is a cross-sectional view showing the configuration of the stacked semiconductor module taken on line $III_C$—$III_C$ in FIG. 2.

At a rearward portion of the paper, diodes each having a cathode at the upper portion, and an anode electrode at the lower portion are respectively disposed as shown in FIGS. 3B and 3C. A first switching element 1 at the U-phase upper arm is connected to a first power distribution plate (P side bus bar) 7 through an upper thermal buffering layer 1a. A bottom surface of the first switching element 1 is connected to a U-phase wiring plate (output bus bar) 8 through a lower thermal buffering layer 1b. A top surface of a second switching element 2 at a U-phase lower arm is connected to the U-phase wiring plate (output bus bar) 8 through an upper thermal buffering layer 2a. A bottom surface of the second switching element 2 is connected to a second power distribution plate (N side bus bar) 11u through a lower thermal buffering layer 2b. The U-phase wiring plate (output bus bar) 8 is sandwiched by the first and second switching elements 1 and 2. At one part of the U-phase wiring plate (output bus bar) 8, a recessed region is provided, which is not connected to the first switching element 1 through the thermal buffering layer, in a planar geometry. A control electrode bonding pad of the first switching element 1 is disposed in this recessed region so that a first control electrode wiring 12u for driving the first switching element 1 can be connected to the first switching element 1 through the lower thermal buffering layer 1b. For the second switching element 2, a second control electrode wiring 13u for driving the second switching element 2 is formed in the recessed region. Each of the control electrode wirings 12u and 13u is electrically isolated from other wiring layers and other switching elements.

The configuration pertaining to the U-phase was explained above, but, for the V-phase and W-phase, a similar configuration is applied. Namely, for the first, third and fifth switching elements 1, 3 and 5 of the upper arm, all first power distribution plates (P side bus bars) 7 are common. As to the second power distribution plate (N side bus bar), three bus bars 11u, 11v, 11w are represented in FIG. 2, but at a rearward portion of the paper, they merge into a single common bus bar. That is, for the second, fourth and sixth switching elements of the lower arm, the second power distribution plate (N side bus bar) 11u, 11v, 11w are merged into a common bus bar. At a rearward portion of the paper, diodes 14 to 19 are stacked with the switching elements 1 to 6 in parallel as shown in FIGS. 3B and 3C. For all upper diodes 14, 16 and 18, the first power distribution plate (P side bus bar) 7 is common, and for all lower diode 15, 17, 19, the second power distribution plate (N side bus bar) 11 is common.

FIGS. 3A, 3B, and 3C are cross-sectional views showing the configuration of the stacked semiconductor module taken on lines III$_A$—III$_A$, III$_B$—III$_B$, III$_C$—III$_C$ in FIG. 2. FIG. 3A is a cross-sectional view of the region where the first to sixth switching elements 1 to 6 are disposed, and shows corresponding control electrode wirings 12u, 13u, 12v, 13v, 12w, 13w, which are isolated from other wiring layers. FIG. 3B is a cross-sectional view of a region where the first to sixth diodes 14 to 19 are disposed. FIG. 3C shows the state in which the first and second switching elements 1 and 2, the first and second diodes 14 and 15 are connected in parallel respectively.

Copper (Cu) or aluminum (Al) can be used for the wiring plates (output bus bars) 8, 9 and 10, the first power distribution plate (P side bus bar) 7 and the second power distribution plate (N side bus bar) 11. For the upper and lower thermal buffering layers 1a, 1b, 2a, 2b, 3a, 3b, 4a, 4b, 5a, 5b, 6a and 6b, molybdenum (Mo) can be employed, because Mo has a lower coefficient of thermal expansion (CTE) than the material implementing the wiring plates (output bus bars) 8, 9 and 10, or copper, for example, here. Other than molybdenum, hard solders such as a gold-silicon eutectic (Si—Au) or a soft solder such as lead-silver-indium (Pb—Ag—In) can be employed. Even if difference of temperature is provided to the periphery of the bare chips (switching elements) 1 to 6, stress or frictional force induced between each of the switching elements 1 to 6 and the wiring plates (output bus bars) 8, 9 and 10 or between each of the switching elements 1 to 6 and the first power distribution plate (P side bus bar) 7 or the second power distribution plate (N side bus bar) 11, owing to the difference in thermal expansion between the metal and the semiconductor materials can be relaxed by the upper and lower thermal buffering layers 1a, 1b, 2a, 2b, 3a, 3b, 4a, 4b, 5a, 5b, 6a and 6b, therefore allowing reliability of a connection portion between the bare chips (switching elements) 1 to 6 and the wiring plates (output bus bars) 8, 9 and 10 or between the bare chips (switching elements) 1 to 6 and the first power distribution plate (P side bus bar) 7 or the second power distribution plate (N side bus bar) 11 to be improved.

Figure 4:
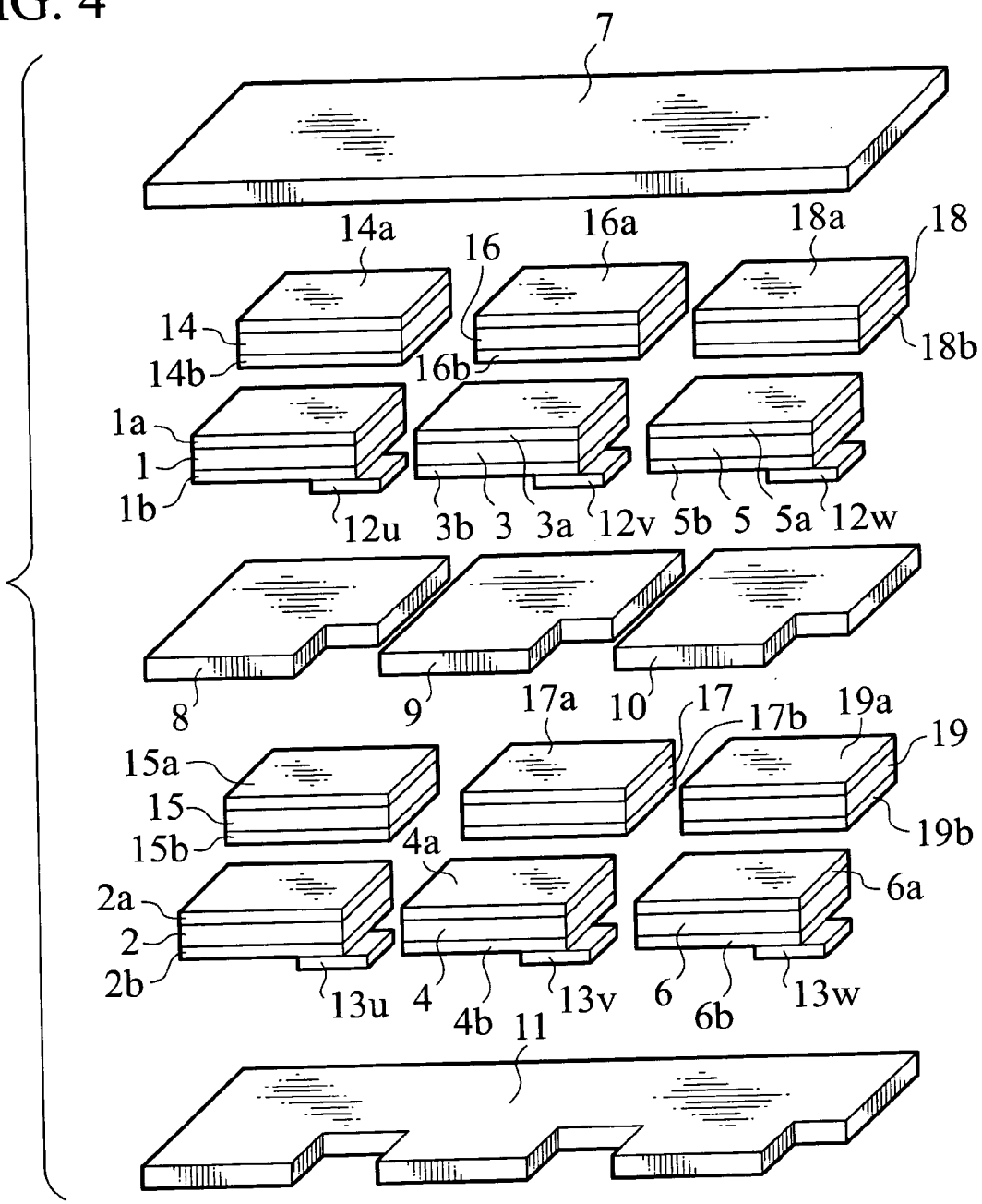
FIG. 4 is an exploded perspective view showing constituent members of the stacked semiconductor module of the first embodiment.

FIG. 4 shows details of the constituent elements of the stacked semiconductor module explained in FIGS. 1, 2, 3B and 3C. As shown in FIG. 4, the first power distribution plate (P side bus bar) 7 and the second power distribution plate (N side bus bar) 11 are common. There are recessed portions where the control electrode bonding pads of respective first to sixth switching elements 1 to 6 are connected with the corresponding first to sixth control electrode wirings 12u, 13u, 12v, 13v, 12w, 13w at limited portions of respective U-phase wiring plates (output bus bars) 8, V-phase wiring plate (output bus bar) 9, and W-phase wiring plate (output bus bar) 10. The recessed portions facilitate the stacked configuration, while maintaining the insulation of the control electrode wirings 12u, 13u, 12v, 13v, 12w, 13w from other wiring layers. As explained above, by the configuration such that the first and second switching elements 1 and 2 implement the first leg-circuit, the third and fourth switching elements 3 and 4 implement the second leg-circuit, and the fifth and six switching elements 5 and 6 implement the third leg-circuit, and such that the first and second switching elements 1 and 2 are disposed on both sides of the U-phase wiring plates (output bus bars) 8, the third and fourth switching elements 3 and 4 are disposed on both sides of the V-phase wiring plate (output bus bar) 9, and the fifth and six switching elements 5 and 6 are disposed on both sides of the W-phase wiring plate (output bus bar) 10, so that the first, third and fifth switching elements 1, 3 and 5 can be connected to the first power distribution plate (P side bus bar) 7 on a plane and the second, fourth and sixth switching elements 2, 4 and 6 can be connected to the second power distribution plate (N side bus bar) 11 on a plane, the planer area occupied by the stacked semiconductor module of the first embodiment can be reduced to substantially a half of that of the earlier semiconductor device.

According to the stacked semiconductor module associated with the first embodiment, without using wire-bonding technology, a structure is implemented in which wiring routes can be connected to the respective control terminals of the first to sixth switching elements 1 to 6, the structure being applicable to press-stacked packaging assembly. Because the first power distribution plate (P side bus bar) 7, the U-phase wiring plates (output bus bars) 8, the V-phase wiring plate (output bus bar) 9, the W-phase wiring plate (output bus bar) 10 and the second power distribution plate (N side bus bar) 11 contact directly with the electrode regions of first to sixth switching elements 1 to 6, through the thermal buffering layer 1a, 1b to 6a, 6b with large contact areas, parasitic inductances between the first to sixth switching elements 1 to 6 and the first power distribution plate (P side bus bar) 7, the U-phase wiring plates (output bus bars) 8, the V-phase wiring plate (output bus bar) 9, the W-phase wiring plate (output bus bar) 10 and the second power distribution plate (N side bus bar) 11 can be reduced to a minimal level. Therefore, in the operation of the three-phase inverter, because a spike voltage due to parasitic inductance in the switching transition period can be suppressed, the rated drain-source voltage of the first to sixth switching elements 1 to 6 can be reduced, contributing to cost reduction.

Then, since the snubber circuits for protecting the stacked semiconductor module can be simplified, cost reduction as a whole of the system can be achieved by the first embodiment.

In earlier inverter, a large scale cooling system using such as a water-cooling module or an oil-cooling module was needed, but by the combination of SiC based semiconductor chip and press-stacked packaging assembly, the inverter can be cooled by a cooling system implemented by a low cost and simple cooling module such as the cooling fins. With the omission of the large scale cooling system, cost reduction of the stacked semiconductor module can be achieved just by removing the costs of the cooling system.

Figure 5:
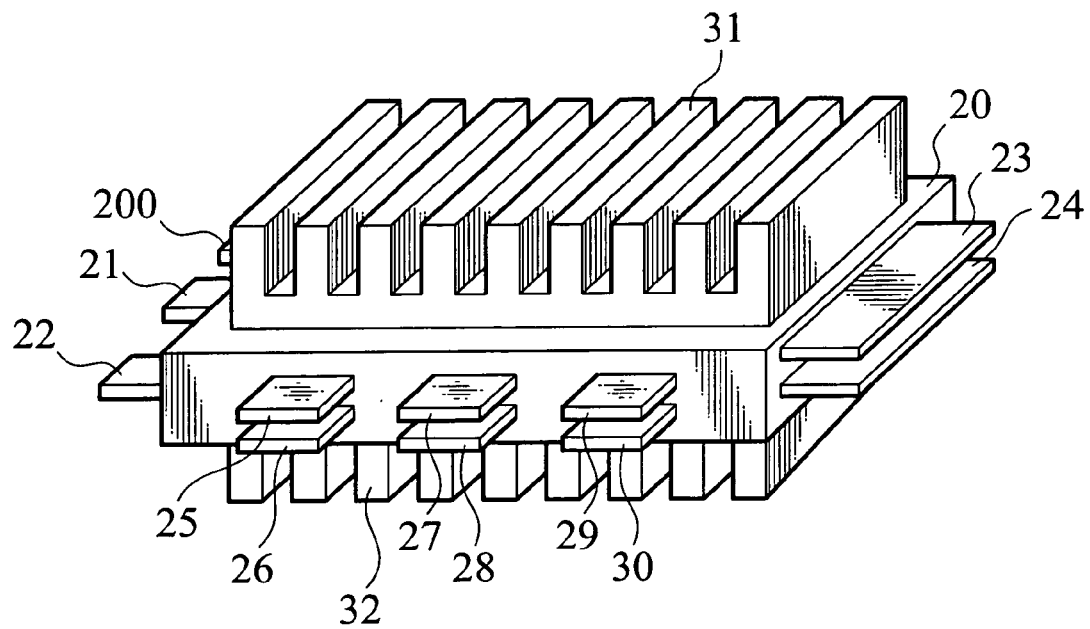
FIG. 5 is a perspective view showing an external geometry of the stacked semiconductor module according to the first embodiment.

FIG. 5 is a perspective view showing an external geometry of the stacked semiconductor module implementing the three-phase inverter according to the first embodiment. In FIG. 5, an upper cooling fin 31 is disposed at the top surface of the stacked semiconductor module, the upper cooling fin 31 is electrically isolated from the bus bar to which high voltage is applied, by an insulation box 20 made of a high thermal conductivity insulation layer. A lower cooling fin 32 is also disposed at the bottom surface of the stacked semiconductor module. Because there is the second power distribution plate (N side bus bar) 11 at the lower part of the stacked semiconductor module, the lower cooling fin 32 can be directly connected to the second power distribution plate (N side bus bar) 11.

On the right side of the stacked semiconductor module shown in FIG. 5, a P-phase input terminal 23 being connected to the first power distribution plate (P side bus bar) 7, serving as an input terminal of the power supply voltage, and an N-phase input terminal 24 being connected to the second power distribution plate (N side bus bar) 11 are disposed. On the left side of the three-phase inverter shown in FIG. 5, a U-phase output terminal 200 being connected to the U-phase wiring plate (output bus bar) 8, which serves as an output terminal, a V-phase output terminal 21 being connected to the V-phase wiring plate (output bus bar) 9, and a W-phase output terminal 22 being connected to the W-phase wiring plate (output bus bar) 10 are disposed.

At the near side of the three-phase inverter shown in FIG. 5, control terminals of the respective switching elements, or a U-phase upper control terminal 25, a U-phase lower control terminal 26, a V-phase upper control terminal 27, a V-phase lower control terminal 28, a W-phase upper control terminal 29, and a W-phase lower control terminal 30 are disposed.

Figure 6:
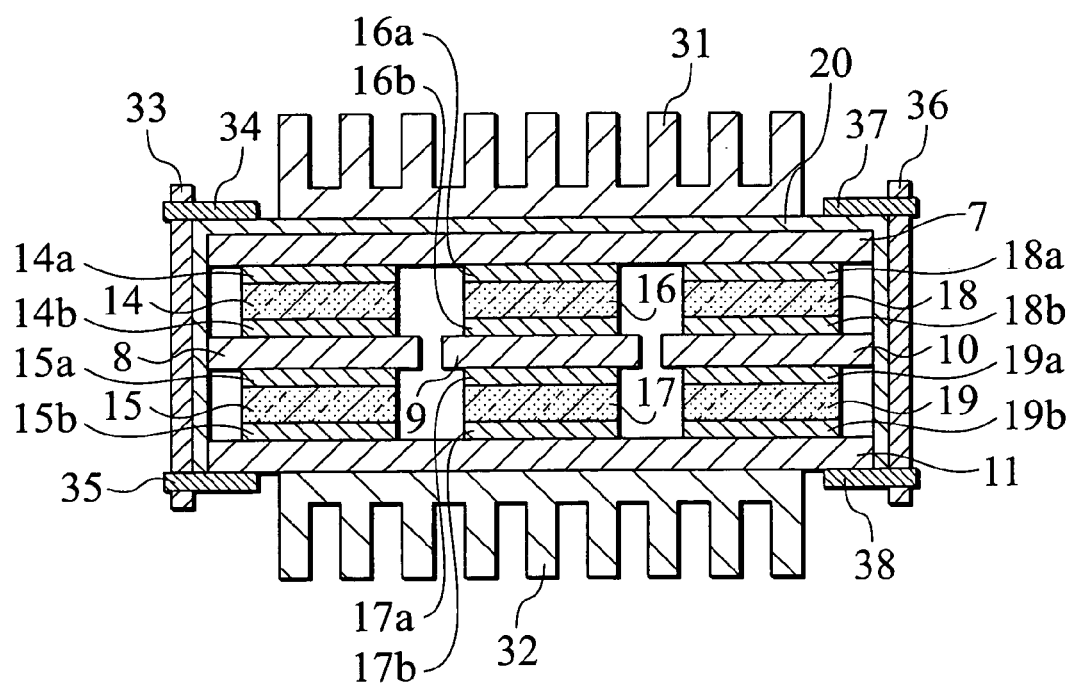
FIG. 6 is a cross-sectional view of the stacked semiconductor module according to the first embodiment.

FIG. 6 shows one of the cross-sectional views of the stacked semiconductor module according to the first embodiment. For example, to implement the press-stacked packaging assembly, there are fixing jigs 34, 35, 37 and 38 sandwiching both peripheries of respective stacked elements at uppermost and lowermost portion of the stacked structure, and these fixing jigs 34, 35, 37 and 38 are connected to each other by pressing screws 33 and 36 respectively. By such an assembly structure, the cooling system is simplified, and a system for a stacked semiconductor module such as a three-phase inverter can be provided at low costs. In order to implement the stacked semiconductor module having a strong tolerance to high temperatures, a configuration which does not employ solder is necessary, but to form a stacked structure eliminating solders, the alignment of each elements becomes important.

The assembling method of the stacked semiconductor module according to the first embodiment, facilitating an easy alignment, is explained by referring to sectional views shown in FIGS. 7A–7C, and FIGS. 8A–8C, which show principal portions of the inverter. Between the first power distribution plate (P side bus bar) 7 and the U-phase wiring plate (output bus bar) 8, between the first power distribution plate (P side bus bar) 7 and the V-phase wiring plate (output bus bar) 9, between the first power distribution plate (P side bus bar) 7 and the W-phase wiring plate (output bus bar) 10, between the U-phase wiring plate (output bus bar) 8 and the second power distribution plate (N side bus bar) 11, between the V-phase wiring plate (output bus bar) 9 and the second power distribution plate (N side bus bar) 11, or between the W-phase wiring plate (output bus bar) 10 and the second power distribution plate (N side bus bar) 11, insulation layers are disposed respectively to maintain the electric insulation with a short distance of approximately same thickness as the first to sixth switching elements 1 to 6. However the insulation layers are not illustrated in FIGS. 2–6, to avoid cluttering up the drawings.

Figure 7A:
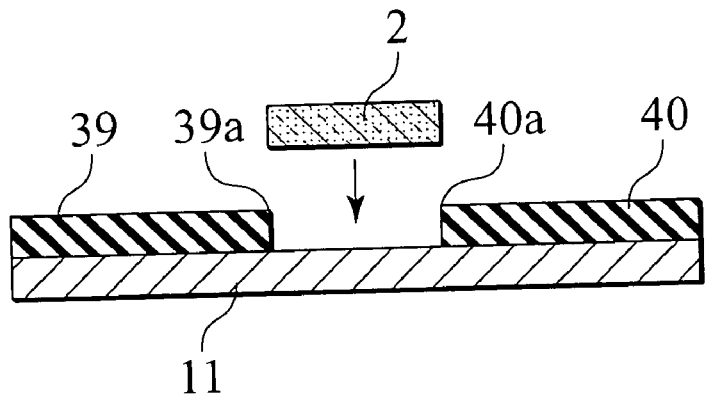
FIGS. 7A–7C are process cross-sectional views showing an assembling method of the stacked semiconductor module according to the first embodiment.

(a) At first, as shown in FIG. 7A, lower insulation layers 39 and 40 are disposed on a second power distribution plate (an N side bus bar) 11. Next, a second switching element 2 is mounted on the second power distribution plate (N side bus bar) 11 between the lower insulation layers 39 and 40. In this case, edges of the lower insulation layer 39 and the lower insulation layer 40, sandwiching the lower switching element (second switching element) 2, are used as a guide for alignments. In the cross-section, the lower insulation layers 39 and 40 are represented, but the lower insulation layers 39 and 40 can merge into a single piece of a lower insulation layer at a rearward portion of and at the near side of the paper. In this situation, the edges of the lower insulation layer 39 and the lower insulation layer 40 corresponds to the edge of a window potion formed in the lower insulation layer (39, 40). Therefore, four sides (or edges) of the rectangular lower switching element (second switching element) 2 are defined by the window potion formed in the lower insulation layer (39, 40).

Figure 7B:
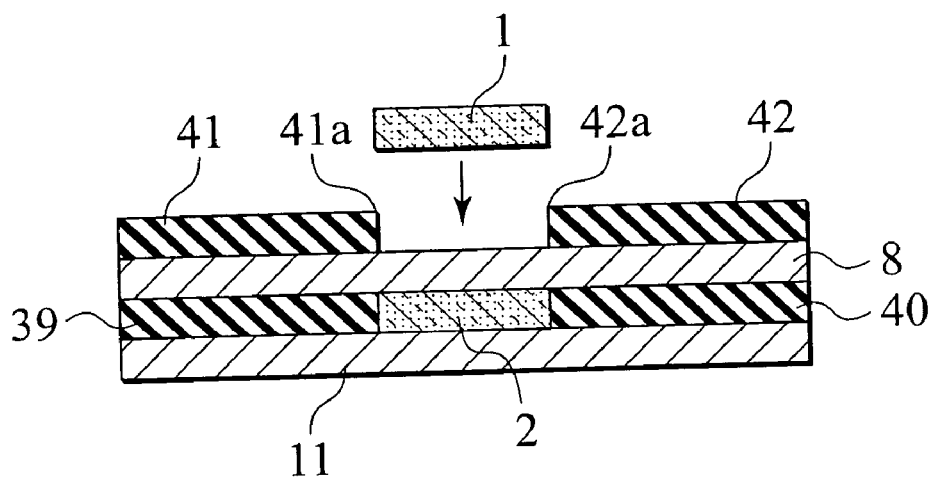

(b) Next, as shown in FIG. 7B, after stacking a U-phase wiring plate (output bus bar) 8 on the lower switching element (second switching element) 2, upper insulation layers 41 and 42 are stacked again. Next, a first switching element 1 is mounted on the U-phase wiring plate (output bus bar) 8 between the upper insulation layers 41 and 42. In this case, the edges of the upper insulation layer 41 and the upper insulation layer 42 are used as a guide for alignments. In the cross-section, the upper insulation layer 41 and the upper insulation layer 42 are represented, but the upper insulation layer 41 and the upper insulation layer 42 can merge into a single piece of an upper insulation layer at a rearward portion of and at the near side of the paper. In this situation, the edges of the upper insulation layer 41 and the upper insulation layer 42 corresponds to the edge of a window potion formed in the upper insulation layer (41, 42). Therefore, four sides of the upper switching element (first switching element) 1 are defined by the window potion formed in the upper insulation layer (41, 42).

Figure 7C:
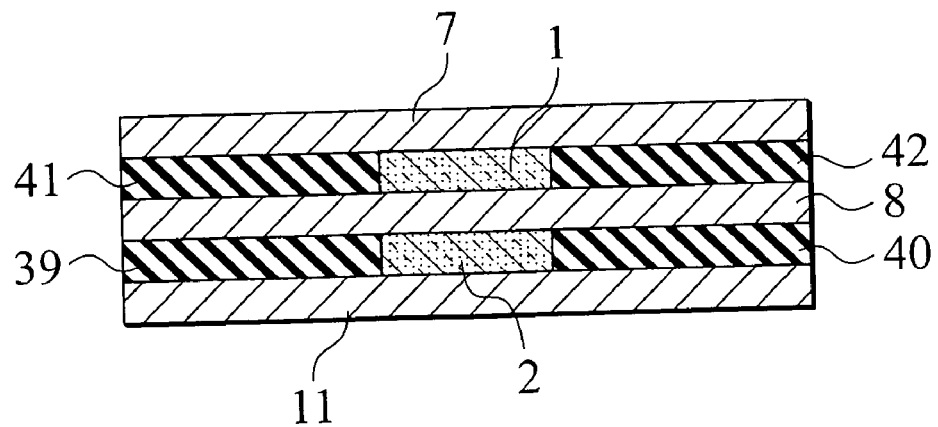

(c) Finally, as shown in FIG. 7C, by stacking a first power distribution plate (P side bus bar) 7 on the upper switching element (first switching element) 1, the assembly process according to the first embodiment is completed.

Because the upper and lower switching elements (first and second switching elements) 1 and 2 are mounted by using guides defined by the insulation layers disposed on the wiring plates, the alignment of the upper and lower switching elements (first and second switching elements) 1 and 2 are becomes easy. The same assembling method can be applied to the second set of the upper and lower switching elements (third and fourth switching elements) 3 and 4 or to the third set of the upper and lower switching elements (fifth and sixth switching elements) 5 and 6, and a simple press-stacked packaging assembly, or the stacked semiconductor module can be achieved, therefore the reduction of manufacturing costs can be facilitated according to the first embodiment.

Figure 8A:
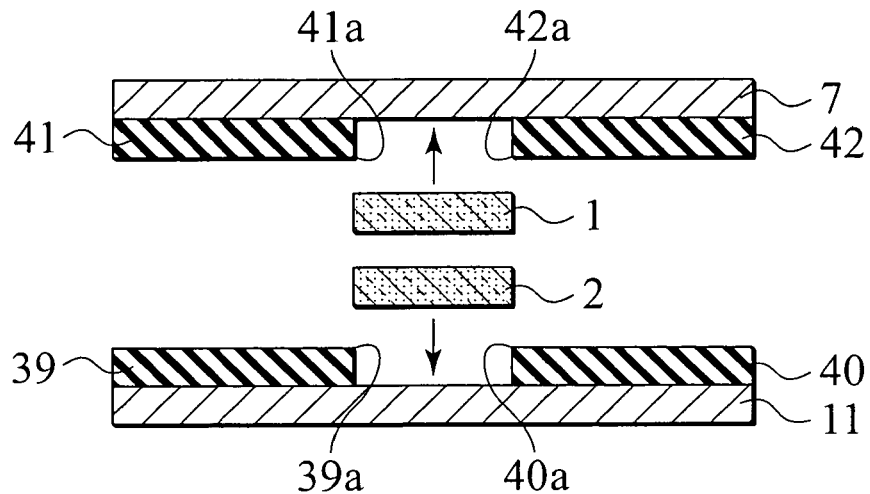
FIGS. 8A–8C are process cross-sectional views showing another assembling method of the stacked semiconductor module according to the first embodiment.
Figure 8B:
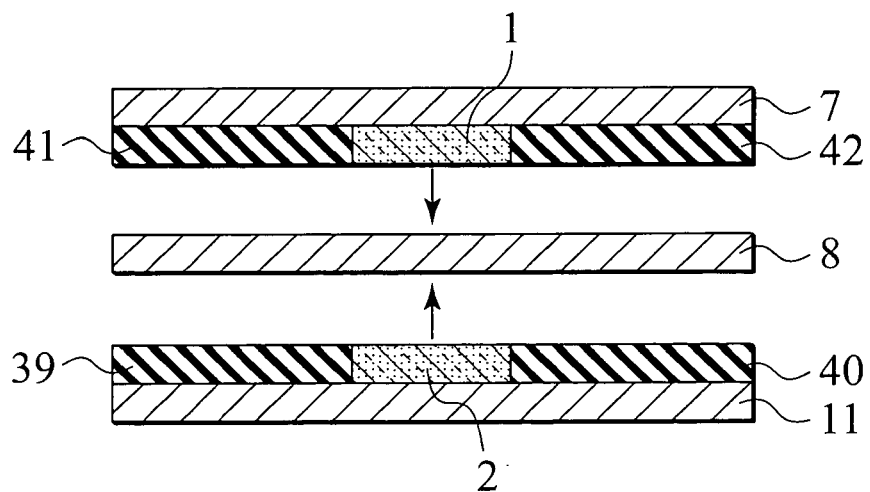
Figure 8C:
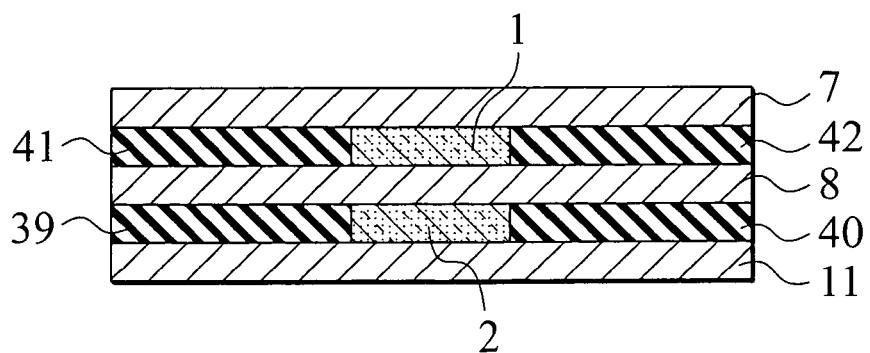

Another assembly process of the stacked semiconductor module according to the first embodiment is shown in FIGS. 8A–8C.

(a) At first, as shown in FIG. 8A, lower insulation layers 39 and 40 are disposed on a second power distribution plate (N side bus bar) 11 respectively. And a second switching element 2 is mounted on the second power distribution plate (N side bus bar) 11, using edges of the lower insulation layer 39 and the lower insulation layer 40 as guides as shown in lower portion of FIGS. 8A and 8B. In the cross-section, the lower insulation layers 39 and 40 are represented, but the lower insulation layer 39 and 40 can merge into a single piece of a lower insulation layer at a rearward portion of and at the near side of the paper. In this situation, the edges of the lower insulation layer 39 and the lower insulation layer 40 corresponds to the edge of a window potion formed in the lower insulation layer (39, 40).

(b) Then, the upper insulation layers 41 and 42 are stacked on a first power distribution plate (P side bus bar) 7. And a first switching element 1 is mounted on the first power distribution plate (P side bus bar) 7, using edges of the upper insulation layer 41 and the upper insulation layer 42 as a guide as shown in upper portion of FIGS. 8A and 8B. In the cross-section, the upper insulation layer 41 and the upper insulation layer 42 are represented, but the upper insulation layer 41 and the upper insulation layer 42 can merge into a single piece of an upper insulation layer at a rearward portion of and at the near side of the paper. In this situation, the edges of the upper insulation layer 41 and the upper insulation layer 42 corresponds to the edge of a window potion formed in the upper insulation layer (41, 42)

(c) Sandwiching a U-phase wiring plate (output bus bar) 8 between the second power distribution plate (N side bus bar) 11 and the first power distribution plate (P side bus bar) 7, on which the upper switching element (first switching element) 1 and the lower switching element (second switching element) 2 are mounted respectively, the assembly is completed as shown in FIGS. 8*b* and 8C.

Because the upper and lower switching elements (first and second switching elements) 1 and 2 are mounted by using guides defined by the insulation layers disposed on the wiring plates, the alignment of the upper and lower switching elements (first and second switching elements) 1 and 2 are becomes easy. The same assembling method can be applied to the second set of the upper and lower switching elements (third and fourth switching elements) 3 and 4 or to the third set of the upper and lower switching elements (fifth and sixth switching elements) 5 and 6, and a simple press-stacked packaging assembly, or the stacked semiconductor module can be achieved, therefore the reduction of manufacturing costs can be facilitated according to the first embodiment.

In Japanese Patent Laid-Open No. 2001-298152, because the first common electrode is connected to the surfaces of plural switching elements, and the switching elements are arranged in a planar geometry in parallel, there was a problem in that the total size of the stacked semiconductor module became large. By the architecture disclosed in Japanese Patent Laid-Open No. 2001-298152, the evaluation of whole device characteristics cannot be executed until the connection of all switching elements has been completed. Because number of constituent elements was large, to get a product of high reliability, the characteristics of every switching element must be uniform with high reliability, and yield decreased, while assembly costs increased in Japanese Patent Laid-Open No. 2001-298152.

On the contrary, in the stacked semiconductor module according to the first embodiment, because the first and second switching elements 1 and 2 are stacked so that the mutually facing principal surfaces of the stacked first and second switching elements 1 and 2 are connected to the common wiring plate (the U-phase wiring plate (output bus bar) 8, the third and fourth switching elements 3 and 4 are stacked so that the mutually facing principal surfaces of the stacked third and fourth switching elements 3 and 4 are connected to the common wiring plate (the V-phase wiring plate (output bus bar) 9, and the fifth and sixth switching elements 5 and 6 are stacked so that the mutually facing principal surfaces of the stacked fifth and sixth switching elements 5 and 6 are connected to a common wiring plate (the W-phase wiring plate (output bus bar) 10, an area on which first to sixth switching elements 1 to 6 are arranged can be reduced, from among the area occupied by the stacked semiconductor module. Therefore, according to the first embodiment, the stacked semiconductor module, which facilitates miniaturization, can be achieved, and parasitic inductance between the first to sixth switching elements 1 to 6 and the wiring plate can be reduced to a minimal level.

The first switching element 1 has the control electrode in the bottom surface, and the control electrode is electrically isolated from the output wiring layer (the U-phase wiring plate (output bus bar) 8, the second switching element 2 has the control electrode in the bottom surface, and the control electrode is electrically isolated from the second power distribution plate (N side bus bar) 11 to which the low voltage is applied, and a first half bridge circuit is implemented by the first and second switching elements 1 and 2 disposed on the top and bottom surfaces of the U-phase wiring plate (output bus bar) 8. The third switching element 3 has the control electrode in the bottom surface, and the control electrode is electrically isolated from the V-phase output wiring plate (output bus bar) 9, the fourth switching element 4 has the control electrode in the bottom surface, and the control electrode is electrically isolated from the second power distribution plate (N side bus bar) 11 to which the low voltage is applied, and a second half bridge circuit is implemented by the third and fourth switching elements 3 and 4 disposed at the top and bottom surfaces of the V-phase wiring plate (output bus bar) 9. The fifth switching element 5 has the control electrode in the bottom surface, and the control electrode is electrically isolated from the W-phase output wiring plate (output bus bar) 10, the sixth switching element 6 has the control electrode in the bottom surface, and the control electrode is electrically isolated from the second power distribution plate (N side bus bar) 11 to which the low voltage is applied, and a third half bridge circuit is implemented by the fifth and sixth switching elements 5 and 6 disposed at the top and bottom surfaces of the W-phase wiring plate (output bus bar) 10.

Because, the first to sixth switching elements 1 to 6 each having a control terminal are stacked, the first, second and third half bridge circuits as principal parts of the inverter can be miniaturized. In addition, the current in the diode 14 to 19 conducts from the second power distribution plate (N side bus bar) 11 to the first power distribution plate (P side bus bar) 7. Because the first and second diodes 14 and 15 are stacked at upper and lower sides of the U-phase wiring plate (output bus bar) 8 so as to implement a first half bridge circuit, the third and fourth diodes 16 and 17 are stacked at upper and lower sides of the V-phase wiring plate (output bus bar) 9 so as to implement a second half bridge circuit, and the fifth and sixth diodes 18 and 19 are stacked at upper and lower sides of the W-phase wiring plate (output bus bar) 10 so as to implement a third half bridge circuit, these set of the upper diode and the lower diode (14, 15; 16, 17; 18,19) can be miniaturized. Because the diodes are stacked as first, second and third sets (14, 15; 16, 17; 18,19) so as to implement the first, second and third half bridges, one leg-circuit of the inverter can be miniaturized.

Two or three half bridges are connected in parallel to the first power distribution plate (P side bus bar) 7, to which a high voltage is applied, so that the two or three half bridges merge into a common wiring layer 7. In the first embodiment, the case that the first, second and third half bridges are connected in parallel is explained. Further, the two or three output wiring layers (the U-phase wiring plate (output bus bar) 8, the V-phase wiring plate (output bus bar) 9, the W-phase wiring plate (output bus bar) 10) are provided corresponding to the parallel number of half bridges, and the second power distribution plate (N side bus bar) 11 to which the low voltage is applied is made as a common wiring layer. As half bridge circuits corresponding to two or three-phases are merged into a common metallic wiring, the whole scale of the stacked semiconductor module can be miniaturized, and parasitic inductance of the wiring can be made minimal low level.

As both of the first switching element 1 disposed in the upper arms and the second switching element 2 disposed in the lower arms, has a region in which the first and second switching elements 1 and 2 can not directly contact each other, the corresponding control terminals for the first and second switching elements 1 and 2 can be routed easily in the same direction. As both of the third switching element 3 disposed in the upper arms and the fourth switching element 4 disposed in the lower arms, has a region in which the third and fourth switching elements 3 and 4 can not directly contact each other, the corresponding control terminals for which the third and fourth switching elements 3 and 4 can be routed easily in the same direction. As both of the fifth switching element 5 disposed in the upper arms and the sixth switching element 6 disposed in the lower arms, has a region in which the fifth and sixth switching elements 5 and 6 can not directly contact each other, the corresponding control terminals for which the fifth and sixth switching elements 5 and 6 can be routed easily in the same direction.

By implementing a first parallel layout of the first, third and fifth switching elements 1, 3 and 5 in the upper arms, and a second parallel layout of the second, fourth and sixth switching elements 2, 4 and 6 in the lower arms, the routing of the wirings to the respective control electrodes of the first to sixth switching elements 1 to 6 can be facilitated in the same direction easily. In the assembling method of the stacked semiconductor module according to the first embodiment, the wiring plate (the high-voltage bus bar) 7 to which the high voltage is applied, the first, third and fifth switching elements 1, 3 and 5 and the first, third and fifth diodes 14, 16 and 18 arranged at upper arm, the output wiring layers (the U-phase wiring plate (output bus bar) 8, the V-phase wiring plate (output bus bar) 9, the W-phase wiring plate (output bus bar) 10), the second, fourth and sixth switching elements 2, 4 and 6 and the second, fourth and sixth diodes 15, 17 and 19 arranged at lower arm, the wiring plate (the low-voltage bus bar) 11 to which the low voltage is applied, are mutually connected by mechanical pressure so as to implement the stacked structure. As described above, because the stacked semiconductor module according to the first embodiment is implemented by the press contact architecture, the small sized structure can be achieved, the interconnection through wire bonding can be eliminated, therefore, it is effective for reducing the number of process stages and manufacturing costs.

SECOND EMBODIMENT

Figure 9A:
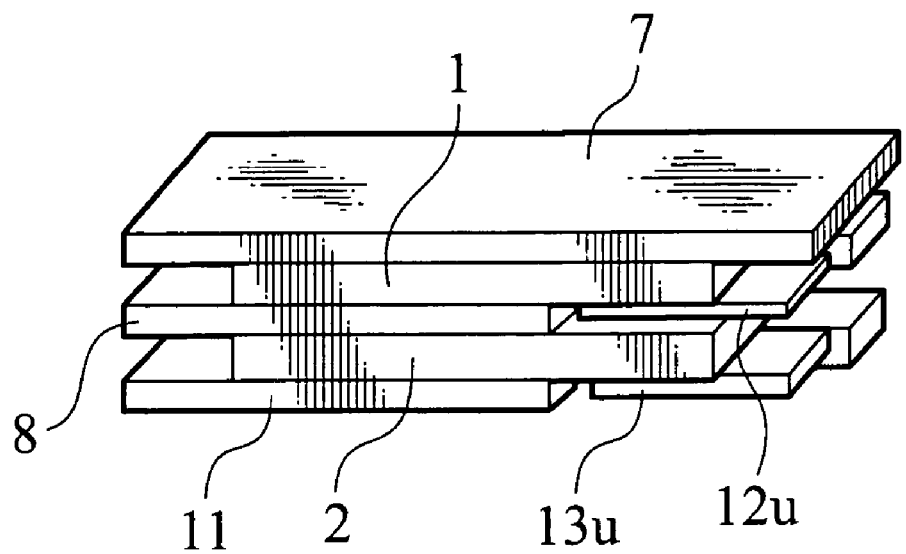
FIG. 9A is a perspective view showing a portion of the stacked semiconductor module associated with a second embodiment, which corresponds to the U-phase circuit of a three-phase inverter.
Figure 9B:
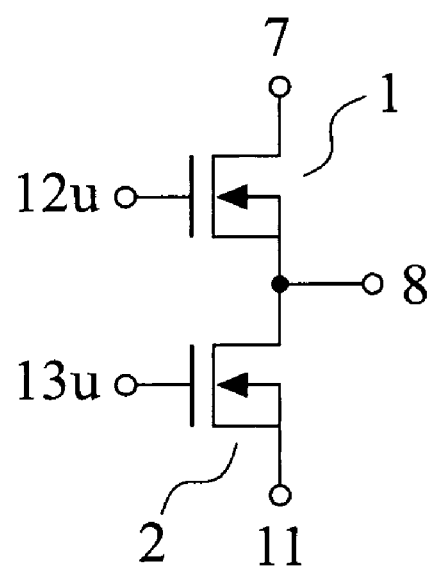
FIG. 9B is a circuit diagram corresponding to FIG. 9A, showing the U-phase circuit of the three-phase inverter.

FIG. 9A is a perspective view showing a portion corresponding to the U-phase circuit of the stacked semiconductor module, or one of basic circuit units of the stacked semiconductor module associated with a second embodiment. That is, the basic circuit unit corresponding to the U-phase circuit shown in FIG. 9B is explained as an example in FIG. 9A, in which an upper switching element (first switching element) 1 and a lower switching element (second switching element) 2 are connected in series so as to implement a single leg-circuit corresponding to the U-phase circuit.

The U-phase circuit of the stacked semiconductor module encompasses the lower switching element 2 and the upper switching element 1 stacked on the lower switching element 2. The upper switching element 1 is connected between a first power distribution plate (P side bus bar) 7 and a U-phase wiring plate (output bus bar) 8. The lower switching element 2 is connected between the U-phase wiring plate (output bus bar) 8 and a second power distribution plate (N side bus bar) 11.

In fact, thermal buffering layers, each relieving thermal stress, are interposed between the first power distribution plate 7 and the U-phase wiring plate 8 so as to sandwich the upper switching element 1 as in the first embodiment. And, another thermal buffering layers, each relieving thermal stress, are interposed between the U-phase wiring plate 8 and the second power distribution plate (N side bus bar) 11 so as to sandwich the lower switching element 2, as in the first embodiment. However, these illustrations are omitted to avoid cluttering up the drawings, in the second embodiment. A control electrode wiring for driving the upper switching element 1 is connected to the bottom surface of the upper switching element 1, and a control electrode wiring for driving the lower switching element 2 is connected to the bottom surface of the lower switching element 2. The control electrode wirings are electrically isolated from other wiring layers and other switching elements.

The basic circuit unit is not facilitated only for the first and second switching elements 1 and 2, but for the series connection of the third and fourth switching elements 3 and 4 or for the series connection of the fifth and sixth switching elements 5 and 6. And by the corresponding series connection of diodes (14, 15; 16, 17; 18, 19) a similar basic circuit unit can be implemented.

Figure 10:
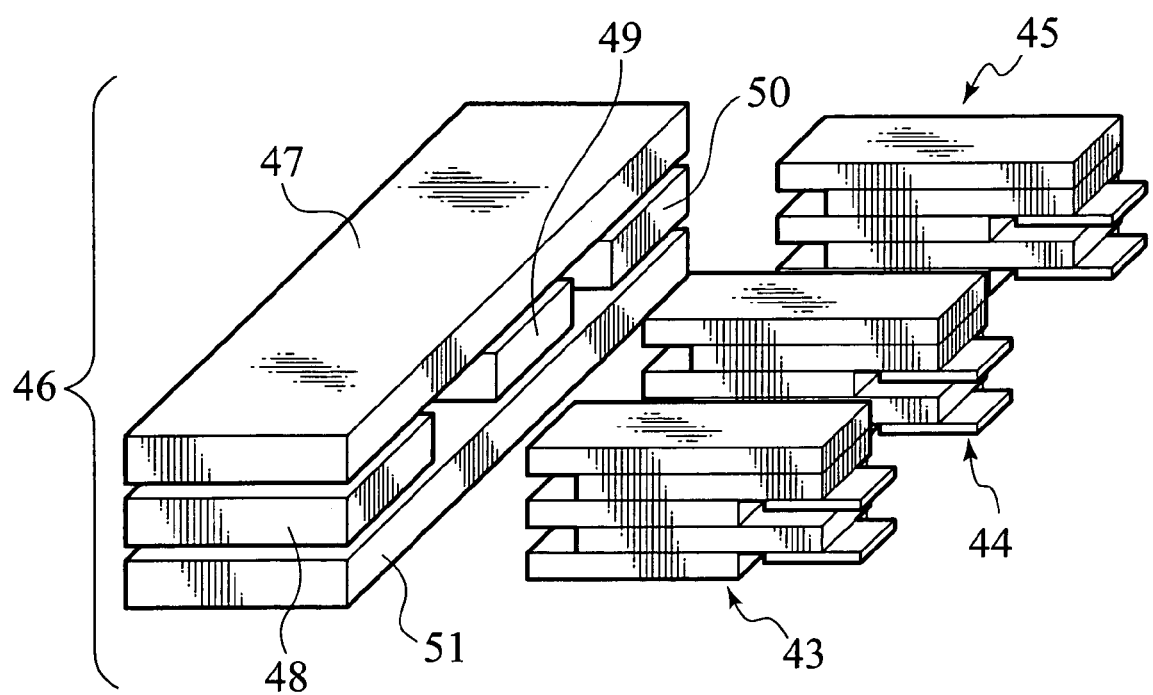
FIG. 10 is an exploded perspective view showing an assembling process of the stacked semiconductor module according to the second embodiment.

FIG. 10 show an assembling process, using first, second, and third basic circuit units 43, 44 and 45 according to the second embodiment, for building up the three-phase stacked semiconductor module, and the first, second, and third basic circuit units 43, 44 and 45 that are scheduled to be connected to a laminated bus bar housing 46.

Figure 11:
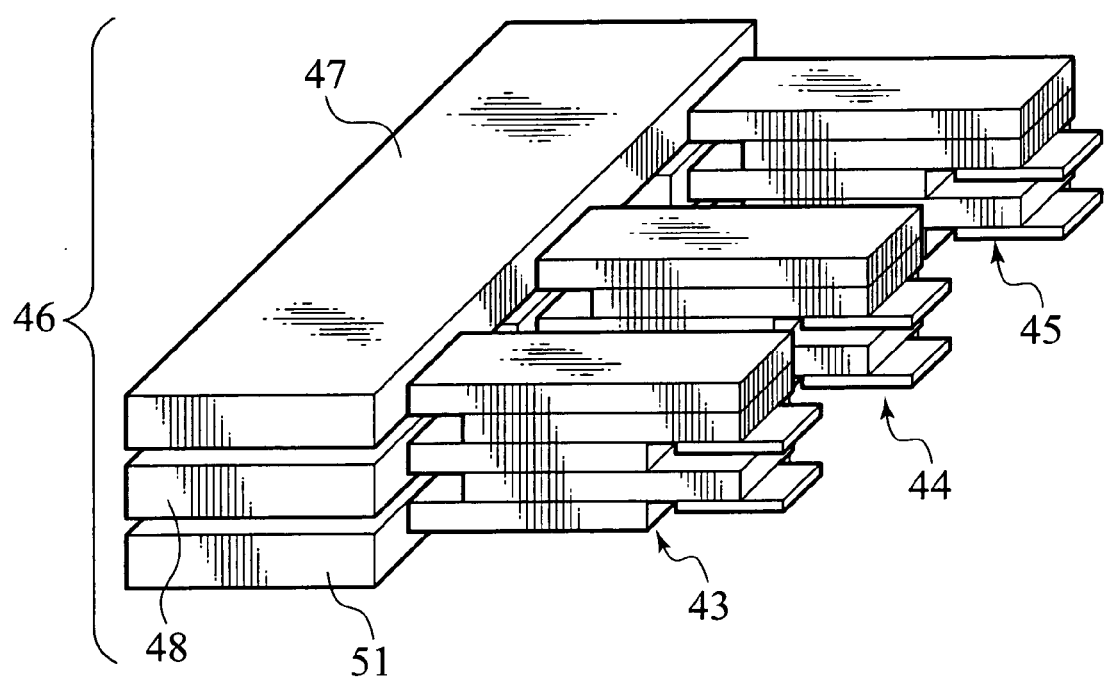
FIG. 11 is a perspective view showing a completed state of the assembling process of the stacked semiconductor module according to the second embodiment.

The laminated bus bar housing 46 encompasses the first power distribution plate 7, the U-phase wiring plate (output bus bar) 8, a V-phase wiring plate (output bus bar) 9, a W-phase wiring plate (output bus bar) 10, and the second power distribution plate 11 stacked. Each of the bus bars is electrically isolated from the other bus bars. Although the illustration is omitted, on the side of the laminated bus bar housing 46, three bores to insert the first, second, and third basic circuit units 43, 44 and 45 are provided. Inserting the first, second, and third basic circuit units 43, 44 and 45 in these bores, the structure of the three-phase inverter is completed as shown in FIG. 11

Although the illustration is omitted, the fourth, fifth, and sixth basic circuit units implemented by the diodes are also inserted to the corresponding bores side of the laminated bus bar housing 46 so as to complete the structure of the three-phase inverter.

By employing the structure and the method of assembly explained above, against the respective basic circuit units 43, 44 and 45, electric evaluation becomes possible beforehand, therefore allowing the three-phase inverter to be assembled under the understanding of the characteristics of the basic circuit units 43, 44 and 45 and reliability to be improved.

Because the product yield of the three-phase inverter improves, cost reduction of the product can be achieved. It is superior in feasibility for maintenance, and even in the cases that a malfunction occurs in one phase circuit from among the three-phase circuits, normal operation can be maintained by changing only one phase circuit. The stacked semiconductor module according to the second embodiment has application feasibility for miscellaneous products, having different phase numbers, such as the three-phase inverter, the H bridge, or half bridge.

THIRD EMBODIMENT

Figure 12A:
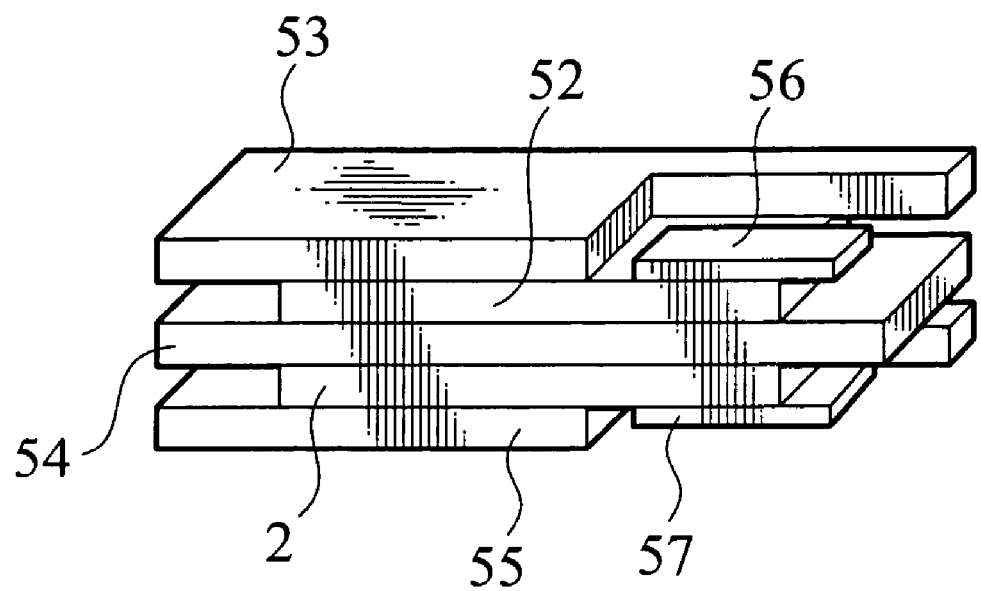
FIG. 12A is a perspective view showing a portion of the stacked semiconductor module associated with a third embodiment, which corresponds to on leg-circuit of a three-phase inverter.
Figure 12B:
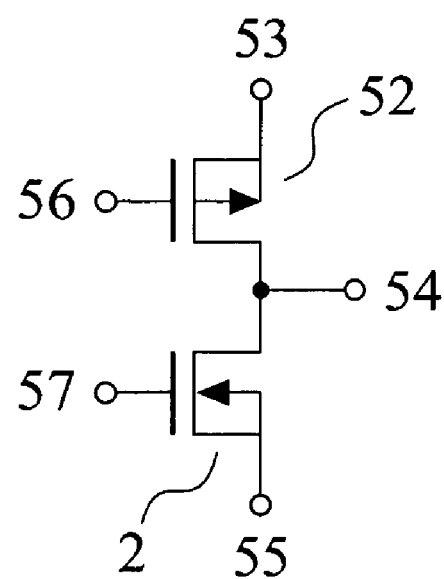
FIG. 12B is a circuit diagram corresponding to FIG. 12A.

FIG. 12A shows a basic circuit unit of the stacked semiconductor module associated with a third embodiment. FIG. 12B shows the corresponding circuit configuration, in which a p channel upper switching element (first switching element) 52 and an n channel lower switching element (second switching element) 2 are connected in series so as to implement a one-phase circuit, or a single leg-circuit. So-called "complementary connection" is established by the single leg-circuit.

Although details are not shown, the upper switching element 52 embraces a first semiconductor chip, a first top electrode disposed at a top surface of the first semiconductor chip, a first bottom electrode disposed at a bottom surface of the first semiconductor chip, and a first control electrode configured to control conduction between the first top and first bottom electrodes. Contrary to the first and second embodiment, the first control electrode is disposed at the top surface of the first semiconductor chip. And, a first wiring plate (U-phase output wiring plate) 54 is disposed beneath the first upper switching element 1, being electrically connected to the first bottom electrode as shown in FIG. 12A.

And, the lower switching element 2 is disposed beneath the wiring plate 54. The lower switching element 2 embraces a second semiconductor chip, a second top electrode disposed at a top surface of the second semiconductor chip, electrically connected to the first wiring plate 54, a second bottom electrode disposed at a bottom surface of the second semiconductor chip, and a second control electrode configured to control conduction between the second top and second bottom electrodes. Similar to the first and second embodiment, the second control electrode is disposed at the bottom surface of the second semiconductor chip.

As stated in the first embodiment, switching elements are symmetrical, and therefore, the source and drain electrodes thereof are replaceable with each other. In the MOSFET, the source and drain electrodes are only a matter of naming, and the terms drain and source can be exchanged without modifying the structure itself. However, in the third embodiment, as shown in FIG. 12B, the first top electrode of the upper switching element 52 serves as the source electrode, the first bottom electrode of the upper switching element 52 serves as the drain electrode, the second top electrode of the lower switching element 2 serves as the drain electrode, and the second bottom electrode of the lower switching element 2 serves as the source electrode.

As shown in FIG. 12A, the p channel upper switching element 52 and the n channel lower switching element 2 are vertically stacked, and the p channel upper switching element 52 is connected between a first power distribution plate (P side bus bar) 53 and the U-phase wiring plate (output bus bar) 54, while the n channel lower switching element 2 is connected between the U-phase wiring plate (output bus bar) 54 and a second power distribution plate (N side bus bar) 55. Actually, thermal buffering layers each relieving thermal stress are interposed between the first power distribution plate 53 and the U-phase wiring plate 54 so as to sandwich the p channel upper switching element 52 similar to in the first embodiment. The thermal buffering layers are also interposed between the U-phase wiring plate 54 and the second power distribution plate 55 so as to sandwich the n channel lower switching element 2. However, these illustrations are omitted in the third embodiment to avoid cluttering up the drawings.

A first control electrode wiring 56 is connected to the first control electrode disposed on the top surface of the p channel upper switching element 52 for driving the p channel upper switching element 52, and second control electrode wiring 57 is formed at the bottom surface of the n channel lower switching element 2 for driving the n channel lower switching element 2. The second control electrode wiring 57 is connected to the second control electrode disposed on the bottom surface of the n channel lower switching element 2. Therefore, the first control electrode wiring 56 is disposed in a recessed region of the first power distribution plate 53, and the second control electrode wiring 57 is disposed in a recessed region of the second power distribution plate 55.

Each of the control electrode wirings 56 and 57 is electrically isolated from other wiring layers and other switching elements. The first control electrode wiring 56 is provided so as to bias a channel region of the p channel upper switching element 52, and the second control electrode wiring 57 is provided so as to bias a channel region of the n channel lower switching element 2. The first control electrode wiring 56 lies in the same horizontal level as the first power distribution plate 53 to which a high voltage is applied. The second control electrode wiring 57 lies in the same horizontal level as the second power distribution plate 55 to which a low voltage is applied.

With the configuration explained above, wiring routes for both control electrodes of the p channel first and n channel second switching elements 52 and 2 can be provided along upper external direction and lower external direction, respectively in the basic circuit unit in which the p channel first and n channel second switching elements 52 and 2 are vertically stacked. The wiring routes for the control electrodes are so designed that the control electrodes can be electrically connected to the corresponding drive circuits disposed outside of the basic circuit unit, respectively. Because the wiring routes are arranged at window portions, which are open to external space, of the basic circuit unit, the external connection become easy, which is a unique technical advantage of the third embodiment.

In the stacked semiconductor module of the third embodiment, the control electrode of the upper switching element 52 is electrically isolated from the first power distribution plate (the high voltage bus bar) 53 to which the high voltage is applied in the top surface, and the control electrode of the lower switching element 2 is electrically isolated from the second power distribution plate (the low voltage bus bar) 55 to which the low voltage is applied in the bottom surface so as to implement a half bridge circuit by two switching elements 52 and 2 disposed at upper and lower arms.

By the complementary connection of the p channel upper switching element 52 and the n channel lower switching element 2, the wiring routes for the control electrodes can be independently provided to the control terminals along upper and lower directions of the stacked structure.

Although the illustration is omitted, along with the upper switching element 52 and the lower switching element 2, the diodes in which current flows in a forward direction, or from the low voltage bus bar 55 to the high voltage bus bar 53 similar to the configuration explained in the first embodiment, are connected in parallel. By the complementary connection implemented by the upper switching element 52 and the lower switching element 2, along which diodes are included in parallel connection so as to establish half bridge circuit, because the upper diode is stacked vertically on the lower diode, the set of the upper diode and the lower diode can be miniaturized.

Although only a single half bridge is represented in FIG. 12B, two or three half bridges are actually connected in parallel, and the wiring plate (the bus bar) 53, to which the high voltage is applied, is merged into a common wiring layer. Further, two or three output wiring plates (output bus bars) 54 are provided corresponding to the parallel number of half bridges, and the second power distribution plate 55 to which the low voltage is made as a common wiring layer. In half bridge circuits, each of half bridge circuits is implemented by the complementary connection of the upper switching element 52 and the lower switching element 2, because two or three-phases are merged into a common metallic wiring, and the whole scale of the stacked semiconductor module can be miniaturized, parasitic inductance of the wiring can be made minimal low level.

In the assembling method of the stacked semiconductor module according to the third embodiment, the first power distribution plate (the high-voltage bus bar) 53 to which the high voltage is applied, the upper switching element 52 and diode arranged at upper arm, the output wiring plate 54, the lower switching element 2 and diode arranged at lower arm, the second power distribution plate (the low-voltage bus bar) 55 to which the low voltage is applied, are mutually connected by mechanical pressure so as to implement the stacked structure. As described above, because the stacked semiconductor module according to the third embodiment is implemented by the press contact architecture, the small sized structure can be achieved, the interconnection through wire bonding can be eliminated, therefore, it is effective for reducing the number of process stages and manufacturing costs.

FOURTH EMBODIMENT

Figure 13:
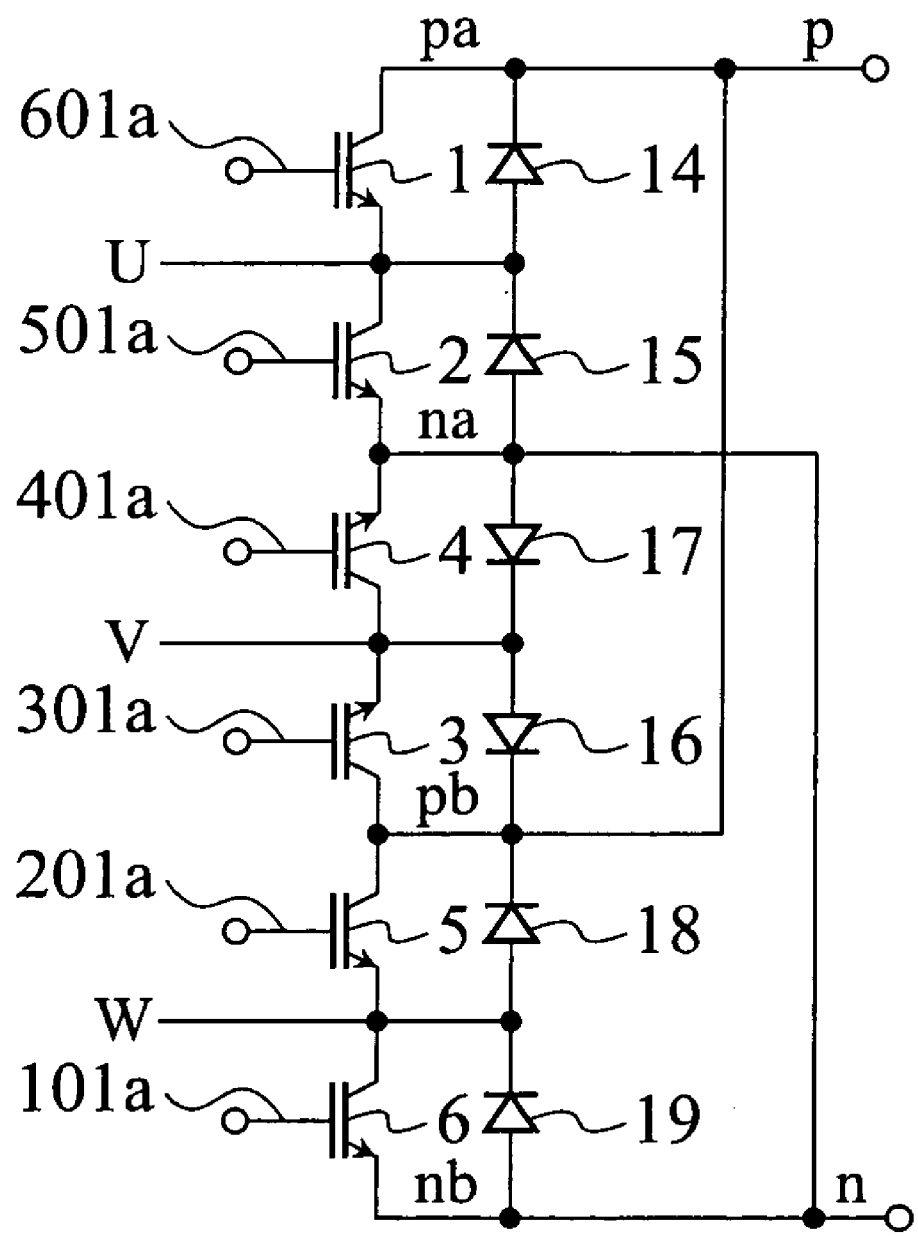
FIG. 13 is a circuit diagram associated with the stacked semiconductor module according to the fourth embodiment, showing a circuit configuration of a three-phase inverter.
Figure 14:
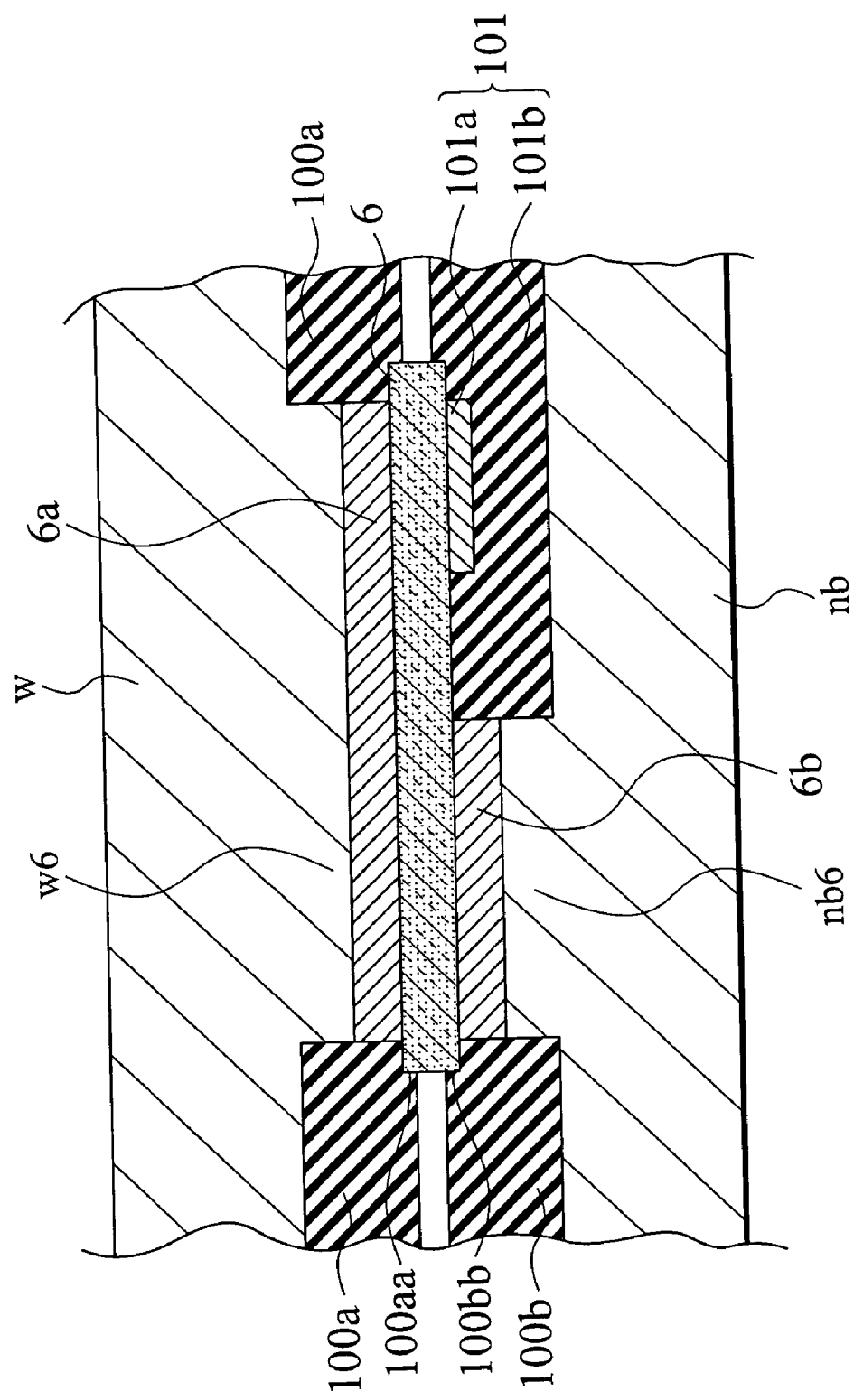
FIG. 14 is a cross-sectional view showing a sixth packaging unit encapsulating a sixth switching element, which implements a part of the configuration of the stacked semiconductor module of the fourth embodiment.

FIG. 14 is a cross sectional view showing a part of a stacked semiconductor module associated with a fourth embodiment of the present invention. FIGS. 15A–15F are respectively exploded perspective views showing constituent members of the stacked semiconductor module shown in FIG. 14. As shown in FIG. 13, the stacked semiconductor module according to the fourth embodiment encompasses W-phase fifth and sixth switching elements 5 and 6, W-phase fifth and sixth diodes 18 and 19, V-phase third and fourth switching elements 3 and 4, V-phase third and fourth diodes 16 and 17, U-phase first and second switching elements 1 and 2 and U-phase first and second diodes 14 and 15 so as to implement a three-phase inverter.

The fifth switching element 5 and the fifth diode 18 connected in parallel correspond to the upper arm of the W-phase, the sixth switching element 6 and the sixth diode 19 connected in parallel correspond to the lower arm of the W-phase; the third switching element 3 and the third diode 16 connected in parallel correspond to the upper arm of the V-phase, the fourth switching element 4 and the fourth diode 17 connected in parallel correspond to the lower arm of the V-phase; and the first switching element 1 and the first diode 14 connected in parallel correspond to the upper arm of the U-phase, the second switching element 2 and the second diode 15 connected in parallel correspond to the lower arm of the U-phase. The first to sixth diodes 14 and 19 serve as free-wheeling diodes respectively. Here, "the upper arm" and "the lower arm" is defined against electrical potentials.

Therefore, although "the lower arm of the V-phase" is disposed above "the upper arm of the V-phase", the third switching element 3 is "the upper switching element" because the third switching element 3 is connected to higher potential, and the fourth switching element 4 is "the lower switching element" because the fourth switching element 4 is connected to lower potential. Namely, the first, third and fifth switching elements 1, 3 and 5 are called as "upper switching elements" and the second, fourth and sixth switching elements 2, 4 and 6 are called as "lower switching elements". Therefore, the first, third and fifth switching elements 1, 3 and 5 can be called as the first, second and third upper switching elements, and the second, fourth and sixth switching elements 2, 4 and 6 can be called as the first, second and third lower switching elements, respectively.

Similar to the first embodiment, a series circuit of the first switching element 1 and the second switching element 2 implement a first leg-circuit, a series circuit of the third switching element 3 and the fourth switching element 4 implement a second leg-circuit, and a series circuit of the fifth switching element 5 and the six switching element 6 implement a third leg-circuit.

The fifth switching element 5 is sandwiched by a first power distribution plate (P side bus bar) pb and an wiring plate (output bus bar) w. A third switching element 3 is sandwiched by the first power distribution plate (P side bus bar) pb and an wiring plate (output bus bar) v. A fourth switching element 4 is sandwiched by the wiring plate (output bus bar) v and a second power distribution plate (N side bus bar) na. A second switching element 2 is sandwiched by an wiring plate (output bus bar) u and the second power distribution plate (N side bus bar) na. A first switching element 6 is sandwiched by a first power distribution plate (P side bus bar) pa and the wiring plate (output bus bar) u.

The bare chip of the first to sixth switching elements 1 to 6 are respectively encapsulated by first to sixth packaging units, as shown in FIG. 15A to 15F. And the bare chip of the first to sixth diodes 18 and 19 are respectively encapsulated by seventh to twelfth packaging units respectively as shown in FIG. 16A to 16F.

Firstly, among the constituent members in the three-phase inverter shown in FIG. 13, the sixth packaging unit associated with the sixth switching element 6 of the W-phase lower arm will be explained referring to FIG. 14 and FIG. 15A.

In FIG. 14, focusing sequentially from the top, the sixth packaging unit encompasses a W-phase wiring plate (output bus bar) w, an upper insulation layer 100a, an upper thermal buffering layer 6a, a bare chip of the sixth switching element 6, a lower thermal buffering layer 6b, a lower insulation layer 100b, a control electrode slab 101, and second power distribution plate (N side bus bar) nb. The W-phase wiring plate (output bus bar) w serves as a W-phase output electrode. A gate plate 101b and a control electrode wiring 101a implement the control electrode slab 101 as shown in FIG. 15A. The second power distribution plate (N side bus bar) nb serves as an electrode for a low potential.

Copper (Cu) or aluminum (Al) is used for the wiring plate (output bus bar) w and the second power distribution plate (N side bus bar) nb. For the upper and lower thermal buffering layers 6a and 6b, molybdenum (Mo) can be employed, because Mo has a lower coefficient of thermal expansion (CTE) than the material implementing the wiring plate (output bus bar) w, or copper, for example, here. Other than molybdenum, hard solders such as a gold-silicon eutectic (Si—Au) or a soft solder such as lead-silver-indium (Pb—Ag—In) can be employed. Even if difference of temperature is provided to the periphery of the bare chip (the sixth switching element) 6, stress or frictional force induced between the sixth switching element 6 and the wiring plate (output bus bar) w or between the sixth switching element 6 and the second power distribution plate (N side bus bar) nb, owing to the difference in thermal expansion between the metal and the semiconductor materials can be relaxed by the upper and lower thermal buffering layers 6a and 6b, therefore allowing reliability of a connection portion between the bare chip (the sixth switching element) 6 and the wiring plate (output bus bar) w or between the bare chip (the sixth switching element) 6 and the second power distribution plate (N side bus bar) nb to be improved.

For the upper and lower insulation layers 100a and 100b, by employing ceramics such as alumina ($Al_2O_3$) or an aluminum nitride (AlN), having high mechanical strength and excellent thermal conductivity performance, the dielectric insulation characteristics, the heat dissipation performance, and tolerance to high temperature of the stacked semiconductor module can also be improved. Therefore, the melting of the upper and lower insulation layers 100a and 100b by the generation of heat in switching elements or the short-circuit failure can be prevented, and a stacked semiconductor module of high reliability can be implemented.

Figure 15A:
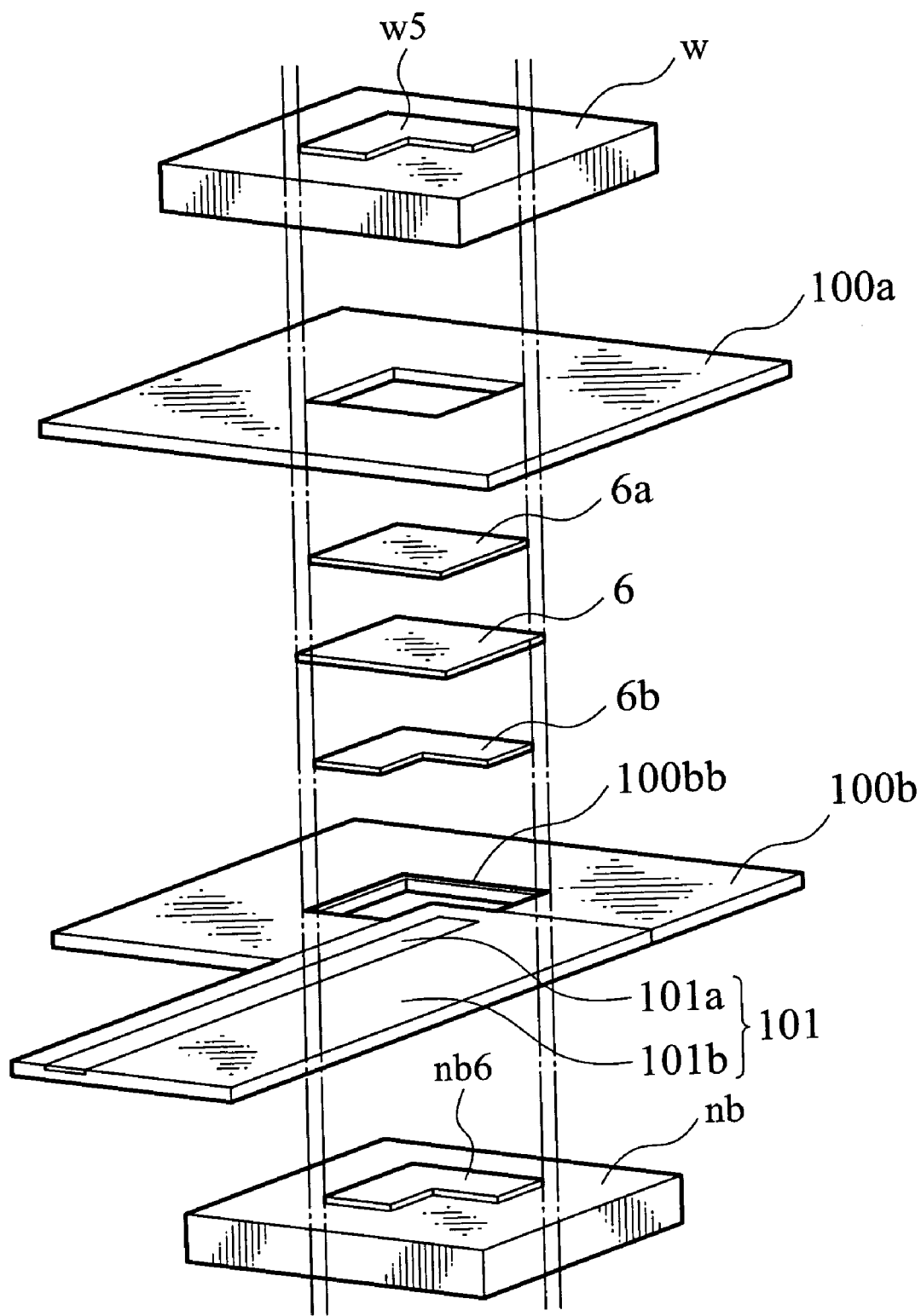
FIG. 15A is an exploded perspective view showing details of the sixth packaging unit encapsulating a sixth switching element.

At a top surface of the lower insulation layer 100b a frame-shaped recess 100bb is provided as shown in FIG. 15A. The frame-shaped recess 100bb is formed so that the perimeter of the bare chip (the sixth switching element) 6 can be mated in the step, when the bare chip (the sixth switching element) 6 is stacked with the lower insulation layer 100b. Similarly, at a bottom surface of the upper insulation layer 100a, another frame-shaped recess 100aa is provided (see FIG. 14) so that the perimeter of the bare chip (the sixth switching element) 6 can be mated in the step, when the sixth switching element 6 is stacked with the upper insulation layer 100a.

For the control electrode wiring 101a, copper-molybdenum (Cu—Mo) having a lower CTE than copper (Cu) and aluminum (Al) or the clad metal containing metal having a lower CTE than copper and aluminum is preferable. By employing material having lower CTE, the stress or the frictional force, which may be induced by the difference of CTE between the sixth switching element 6 and the metal is relaxed when the difference of temperature was provided. Therefore, reliability of the device connection portion and the reliability of the stacked semiconductor module can be improved.

For the gate plate 101b, by employing ceramics such as alumina or an aluminum nitride having high mechanical strength and excellent thermal conductivity performance, the required dielectric insulation between the control electrode wiring 101a and the second power distribution plate (N side bus bar) nb can be established, and the heat dissipation performance and tolerance to high temperature of the stacked semiconductor module can be improved. Because the control electrode slab 101 is made of metal and the ceramics as explained above, the melting of the control electrode wiring 101a due to the generation of heat in the switching elements and the short-circuit failure can be prevented, and a stacked semiconductor module having high reliability can be achieved. Furthermore, heat generated in the switching element can be transferred through the control electrode wiring 101a or the gate plate 101b having high thermal conductivity, and radiated away from the control electrode slab 101.

By attaching a cooling fin to the control electrode slab 101, cooling capability further improves, and miniaturization of the stacked semiconductor module can be achieved.

The configuration shown in FIG. 14, in which the sixth switching element 6 is sandwiched by the wiring plate (output bus bar) w and the second power distribution plate (N side bus bar) nb, is similarly employed in the configurations of other arms.

That is, a fifth switching element 5 of W-phase upper arm is sandwiched by the first power distribution plate (P side bus bar) pb for W- and V-phases and the wiring plate (output bus bar) w. A third switching element 3 of V-phase upper arm is sandwiched by the first power distribution plate (P side bus bar) pb and the wiring plate (output bus bar) v of V-phase. A fourth switching element 4 of V-phase lower arm is sandwiched by the wiring plate (output bus bar) v and the second power distribution plate (N side bus bar) na for V- and U-phases. A second switching element 2 of U-phase lower arm is sandwiched by the wiring plate (output bus bar) u of U-phase and the second power distribution plate (N side bus bar) na. A first switching element 6 of U-phase upper arm is sandwiched by the first power distribution plate (P side bus bar) pa for U-phase and the wiring plate (output bus bar) u.

Figure 15B:
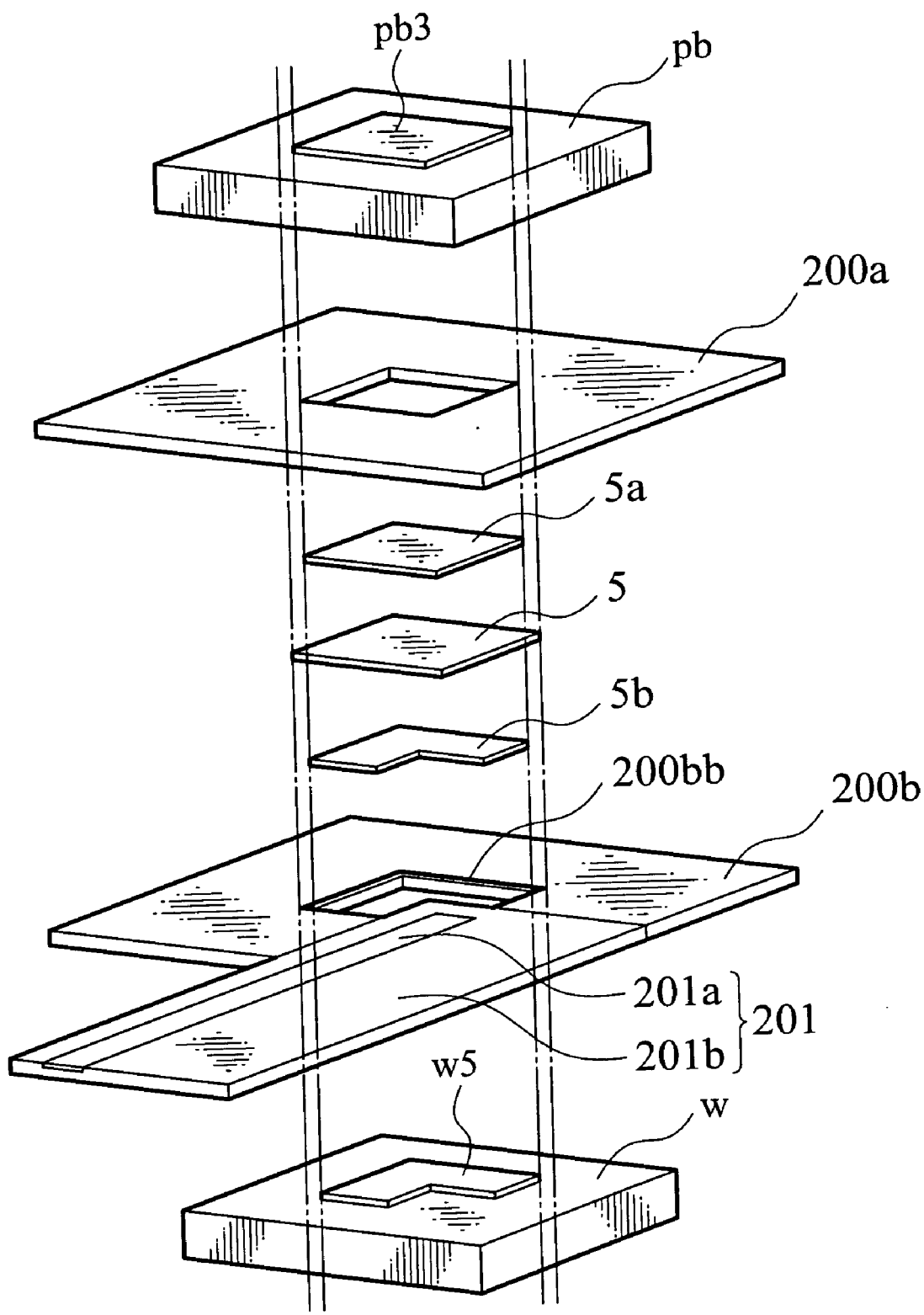
FIG. 15B is an exploded perspective view showing details of a fifth packaging unit encapsulating a fifth switching element.

Then, the fifth packaging unit associated with the fifth switching element 5 of the W-phase upper arm will be explained referring to FIG. 15B. As shown in FIG. 15B, the fifth packaging unit encompasses the first power distribution plate (P side bus bar) pb, an upper insulation layer 200a, an upper thermal buffering layer 5a, a bare chip of the fifth switching element 5, a lower thermal buffering layer 5b, a lower insulation layer 200b, a control electrode slab 201, and the W-phase wiring plate (output bus bar) w. The first power distribution plate (P side bus bar) pb serves as an electrode for a high potential. A gate plate 201b and a control electrode wiring 201a implement the control electrode slab 201 as shown in FIG. 15B. At a top surface of the lower insulation layer 200b of the W-phase upper arm a frame-shaped recess 200bb is provided so that the perimeter of the bare chip (the fifth switching element) 5 can be mated in the step, when the bare chip (the fifth switching element) 5 is stacked with the lower insulation layer 200b. Similarly, at a bottom surface of the upper insulation layer 200a of the W-phase upper arm, another frame-shaped recess is provided so that the perimeter of the bare chip (the fifth switching element) 5 can be mated in the step, when the bare chip (the fifth switching element) 5 is stacked with the upper insulation layer 200a.

Figure 15C:
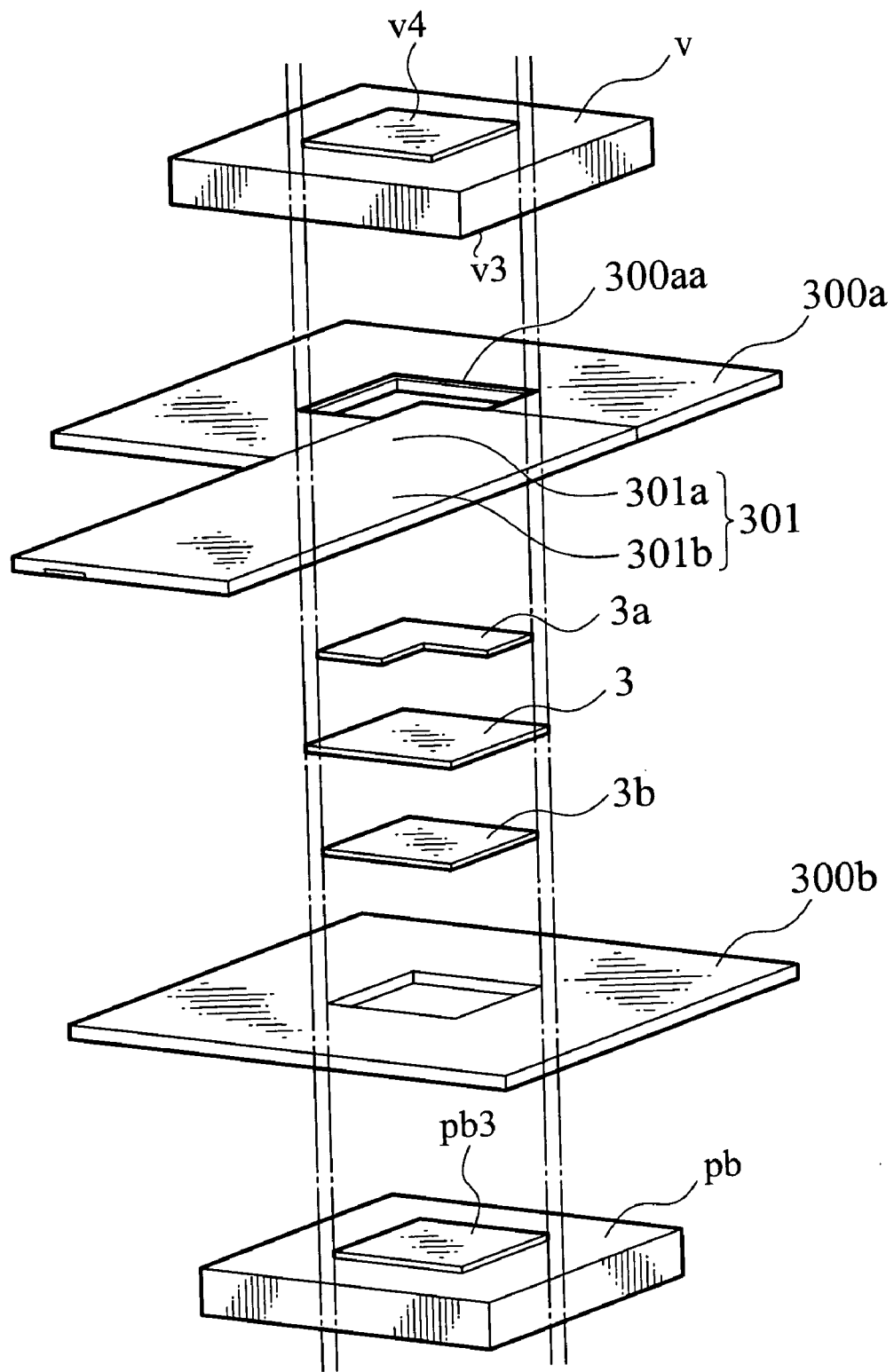
FIG. 15C is an exploded perspective view showing details of a third packaging unit encapsulating a third switching element.

As shown in FIG. 15C, the third packaging unit encompasses the V-phase wiring plate (output bus bar) v, an upper insulation layer 300a, a control electrode slab 301, an upper thermal buffering layer 3a, a bare chip of the third switching element 3, a lower thermal buffering layer 3b, a lower insulation layer 300b, and the first power distribution plate (P side bus bar) pb. The V-phase wiring plate (output bus bar) v serves as a V-phase output electrode. A gate plate 301b and a control electrode wiring 301a implement the control electrode slab 301 as shown in FIG. 15C. At a top surface of the lower insulation layer 300b of the V-phase upper arm a frame-shaped recess 300bb is provided so that the perimeter of the bare chip (the third switching element) 3 can be mated in the step, when the bare chip (the third switching element) 3 is stacked with the lower insulation layer 300b. Similarly, at a bottom surface of the upper insulation layer 300a of the V-phase upper arm, another frame-shaped recess is provided so that the perimeter of the bare chip (the third switching element) 3 can be mated in the step, when the bare chip (the third switching element) 3 is stacked with the upper insulation layer 300a.

Figure 15D:
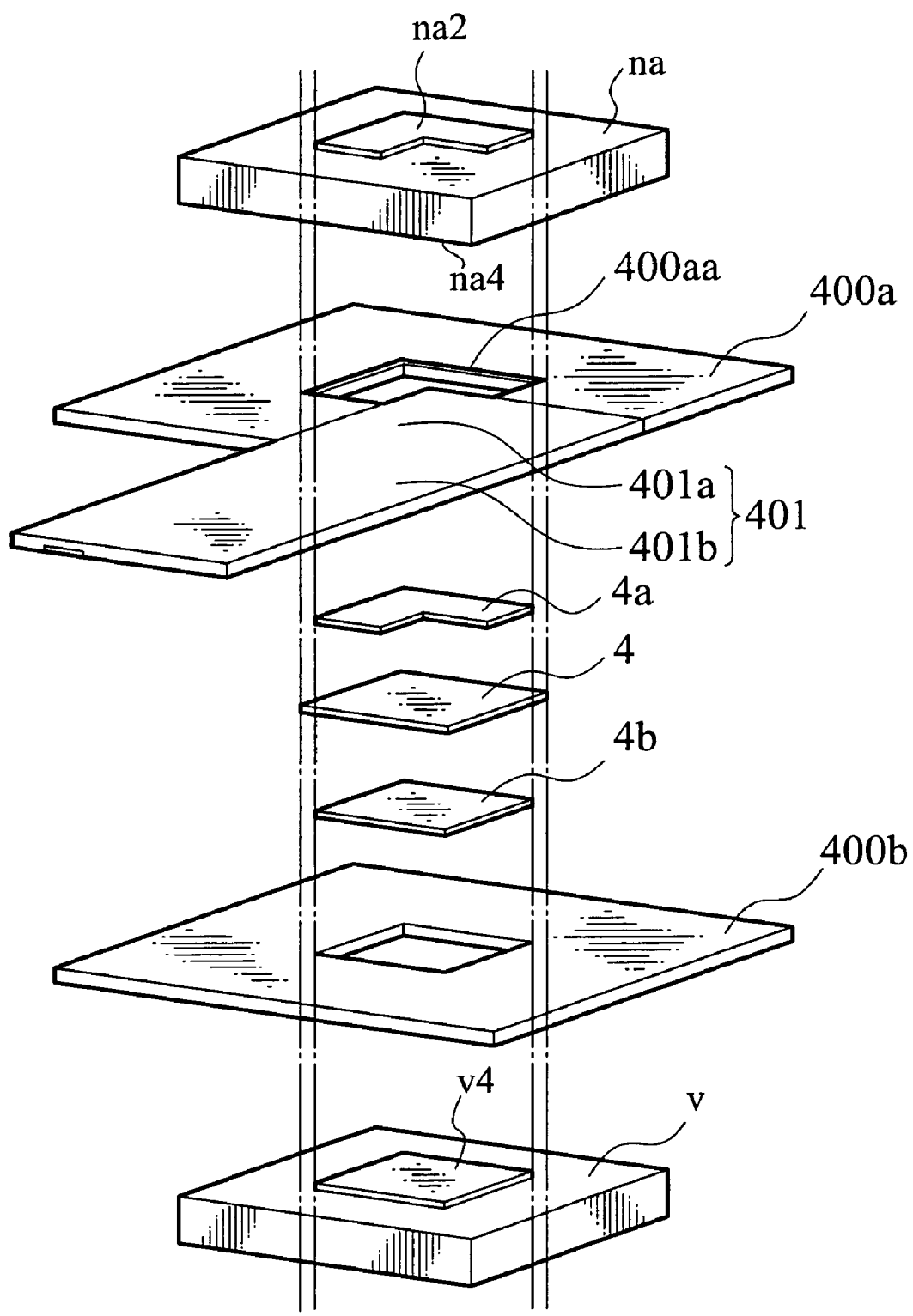
FIG. 15D is an exploded perspective view showing details of a fourth packaging unit encapsulating a fourth switching element.

As shown in FIG. 15D, the fourth packaging unit encompasses the second power distribution plate (N side bus bar) na, an upper insulation layer 400a, a control electrode slab 401, an upper thermal buffering layer 4a, a bare chip of the fourth switching element 4, a lower thermal buffering layer 4b, a lower insulation layer 400b, and the V-phase wiring plate (output bus bar) v. A gate plate 401b and a control electrode wiring 401a implement the control electrode slab 401 as shown in FIG. 15D. At a top surface of the lower insulation layer 400b of the V-phase lower arm a frame-shaped recess 400bb is provided so that the perimeter of the bare chip (the fourth switching element) 4 can be mated in the step, when the bare chip (the fourth switching element) 4 is stacked with the lower insulation layer 400b. Similarly, at a bottom surface of the upper insulation layer 400a of the V-phase lower arm, another frame-shaped recess is provided so that the perimeter of the bare chip (the fourth switching element) 4 can be mated in the step, when the bare chip (the fourth switching element) 4 is stacked with the upper insulation layer 400a.

Figure 15E:
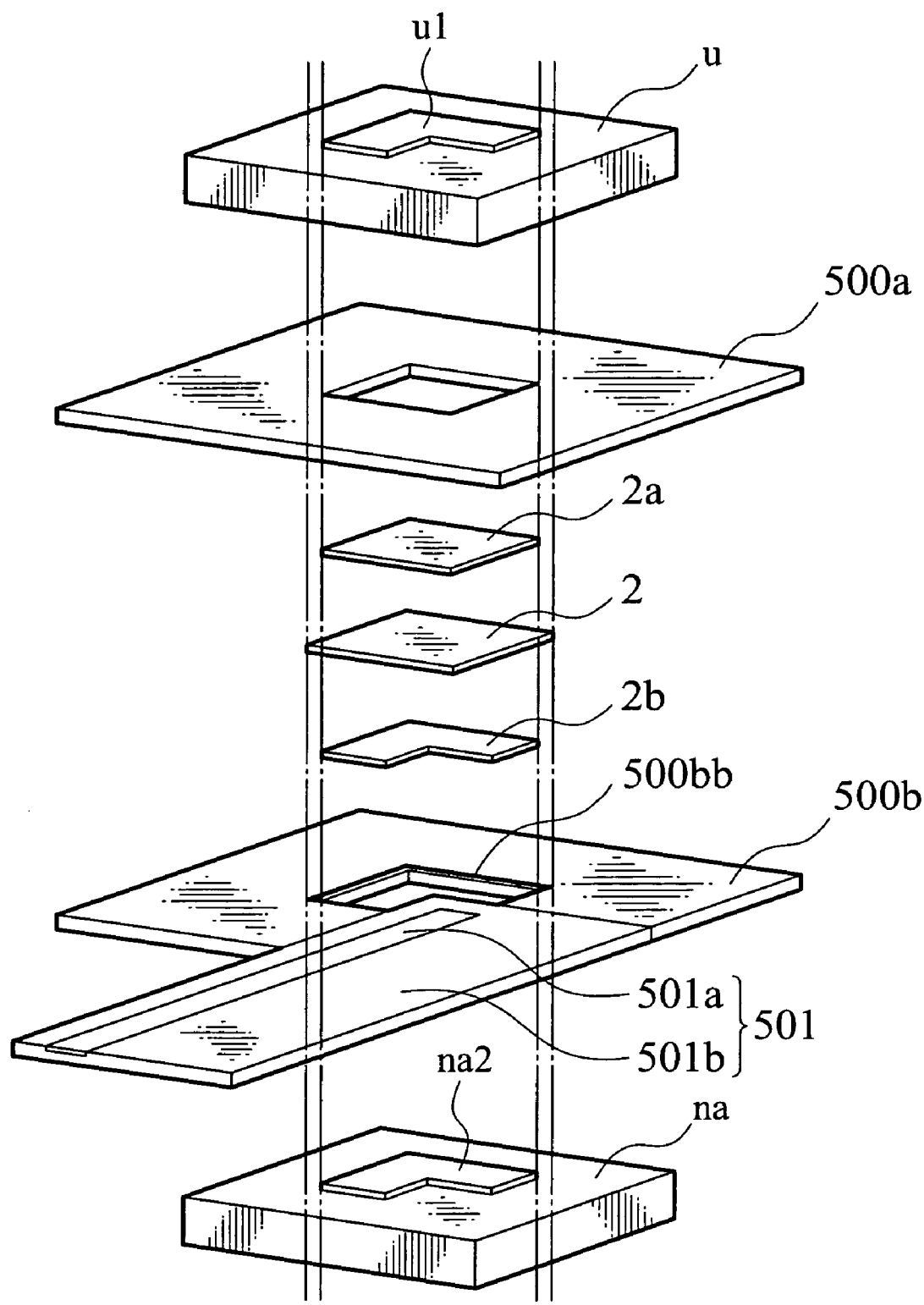
FIG. 15E is an exploded perspective view showing details of a second packaging unit encapsulating a second switching element.

As shown in FIG. 15E, the second packaging unit encompasses the U-phase wiring plate (output bus bar) u, an upper insulation layer 500a, an upper thermal buffering layer 2a, a bare chip of the second switching element 2, a lower thermal buffering layer 2b, a lower insulation layer 500b, a control electrode slab 501, and the second power distribution plate (N side bus bar) na. The U-phase wiring plate (output bus bar) u serves as a U-phase output electrode. A gate plate 501b and a control electrode wiring 501a implement the control electrode slab 501 as shown in FIG. 15E. At a top surface of the lower insulation layer 500b of the U-phase lower arm a frame-shaped recess 500bb is provided so that the perimeter of the bare chip (the second switching element) 2 can be mated in the step, when the bare chip (the second switching element) 2 is stacked with the lower insulation layer 500b. Similarly, at a bottom surface of the upper insulation layer 500a of the U-phase lower arm, another frame-shaped recess is provided so that the perimeter of the bare chip (the second switching element) 2 can be mated in the step, when the bare chip (the second switching element) 2 is stacked with the upper insulation layer 500a.

Figure 15F:
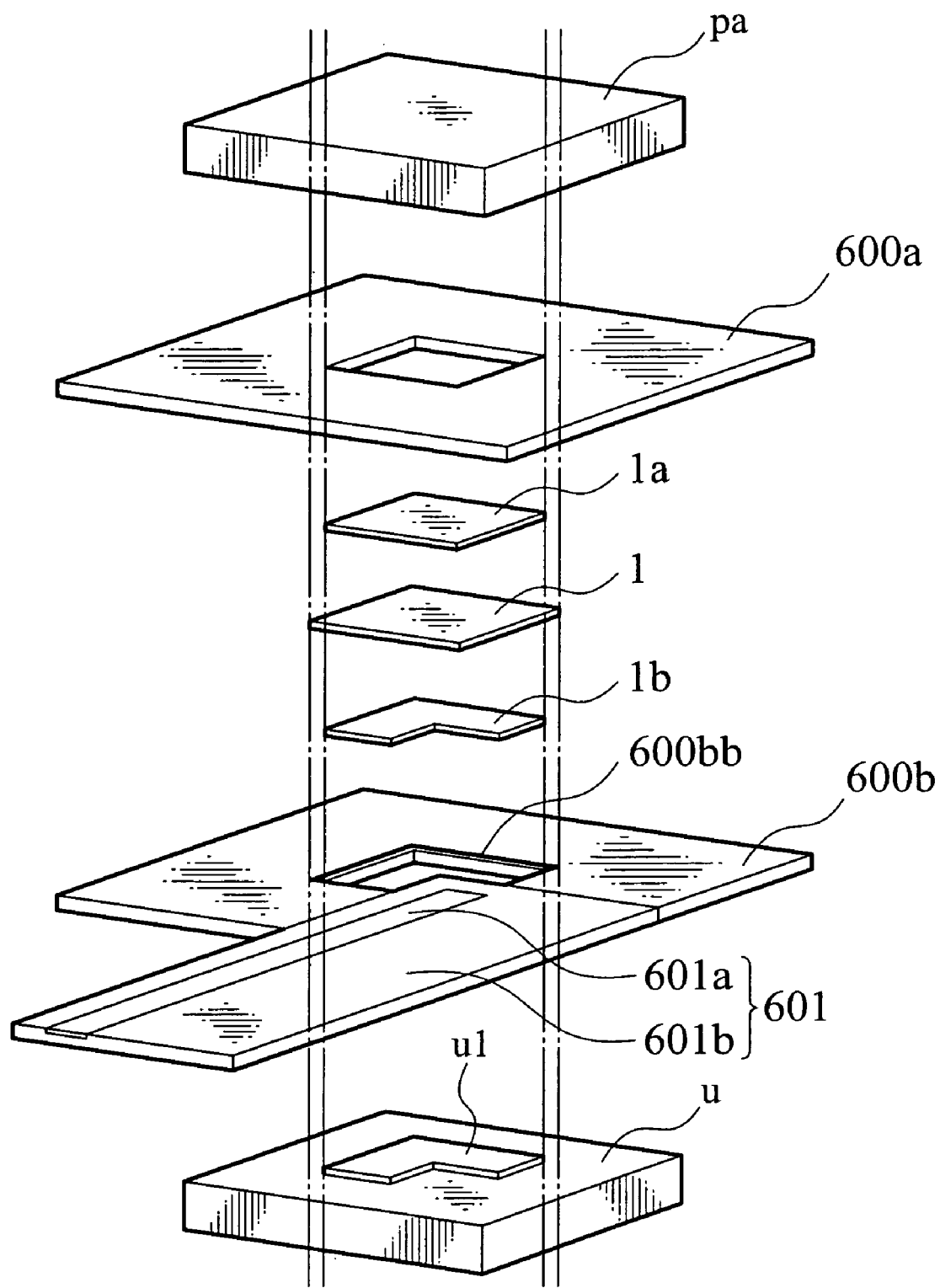
FIG. 15F is an exploded perspective view showing details of a first packaging unit encapsulating a first switching element.

As shown in FIG. 15F, the first packaging unit encompasses the first power distribution plate (P side bus bar) pa, an upper insulation layer 600a, an upper thermal buffering layer 1a, a bare chip of the first switching element 1, a lower thermal buffering layer 1b, a lower insulation layer 600b, a control electrode slab 601, and the U-phase wiring plate (output bus bar) u. A gate plate 601b and a control electrode wiring 601a implement the control electrode slab 601 as shown in FIG. 15F. At a top surface of the lower insulation layer 600b of the U-phase upper arm a frame-shaped recess 600bb is provided so that the perimeter of the bare chip (the first switching element) 1 can be mated in the step, when the bare chip (the first switching element) 1 is stacked with the lower insulation layer 600b. Similarly, at a bottom surface of the upper insulation layer 600a of the U-phase upper arm, another frame-shaped recess is provided so that the perimeter of the bare chip (the first switching element) 1 can be mated in the step, when the bare chip (the first switching element) 1 is stacked with the upper insulation layer 600a.

Output bus bars w, v and u have respectively flat protrusions w5, v4, v3, u1 protruding toward the electrode regions of the corresponding first to sixth switching elements 1 to 6. The second power distribution plate (N side bus bar) nb of W-phase, second power distribution plate (N side bus bar) na of V- and U-phases have respectively flat protrusions nb6, na2, na4, protruding toward the electrode regions of the corresponding second, fourth and sixth switching elements 2, 4 and 6. The first power distribution plate (P side bus bar) pb of W- and V-phases and first power distribution plate (P side bus bar) pa of U-phase have respectively flat protrusions pb3 protruding toward the electrode regions of the corresponding first, third and fifth switching elements 1, 3 and 5. In other words, protrusions are provided on the top and bottom surfaces of the second power distribution plates (N side bus bars) na and nb, the first power distribution plates (P side bus bars) pa and pb, and the wiring plates (output bus bars) w, v and u, respectively. However, the protrusion is not formed on the bottom surface of the second power distribution plate (N side bus bar) nb for W-phase. Similarly, the protrusion is not formed on the top surface of the first power distribution plate (P side bus bar) pa for U-phase.

In a plan view, each of the protrusions nb6, w5, na2 and u1 of the bus bars nb, w, pb, v, na and u is implemented by a concave polygon, or L-shaped polygon, so that the geometry of the protrusion does not occupy the space of the corresponding gate plate 101b, 201b, 301b, 401b, 501b, 601b. On the other hand, each of the protrusions pb3 and v4 of the bus bars pb and v is implemented by a rectangle.

Figure 16A:
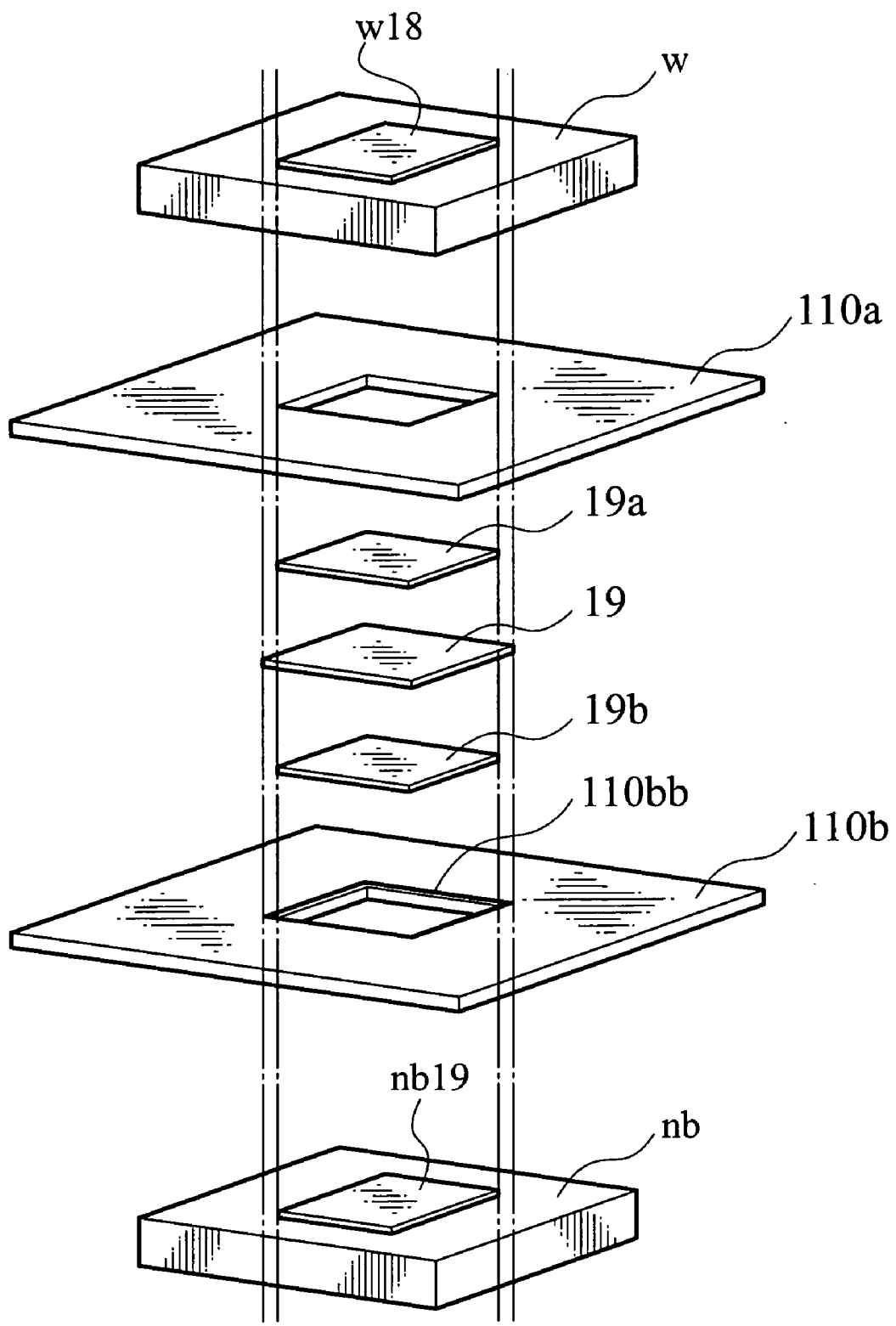
FIG. 16A is an exploded perspective view showing details of the twelfth packaging unit encapsulating a sixth diode.

In the case of the seventh to twelfth packaging unit associated with the diodes 14 to 19, the control electrode slabs 101, 201, 301, 401, 501 and 601 are not required, and the geometry of lower insulation layer 110b, 120b, 130b, 140b, 150b and 160b are the same as the corresponding upper insulation layers 110a, 120a, 130a, 140a, 150a and 160a but with the top and bottom side reversed. Firstly, the twelfth packaging unit associated with the sixth diode 19 of the W-phase lower arm will be explained referring to FIG. 16A. In FIG. 16A, focusing sequentially from the top, the twelfth packaging unit encompasses a W-phase wiring plate (output bus bar) w, an upper insulation layer 110a, an upper thermal buffering layer 19a, a bare chip of the sixth diode 19, a lower thermal buffering layer 19b, a lower insulation layer 110b, and second power distribution plate (N side bus bar) nb. At a top surface of the lower insulation layer 110b a frame-shaped recess 110bb is provided as shown in FIG. 16A. The frame-shaped recess 110bb is formed so that the perimeter of the bare chip (the sixth diode) 19 can be mated in the step, when the bare chip (the sixth diode) 19 is stacked with the lower insulation layer 110b. Similarly, at a bottom surface of the upper insulation layer 110a another frame-shaped recess is provided so that the perimeter of the bare chip (the sixth diode) 19 can be mated in the step, when the sixth diode 19 is stacked with the upper insulation layer 110a.

Figure 16B:
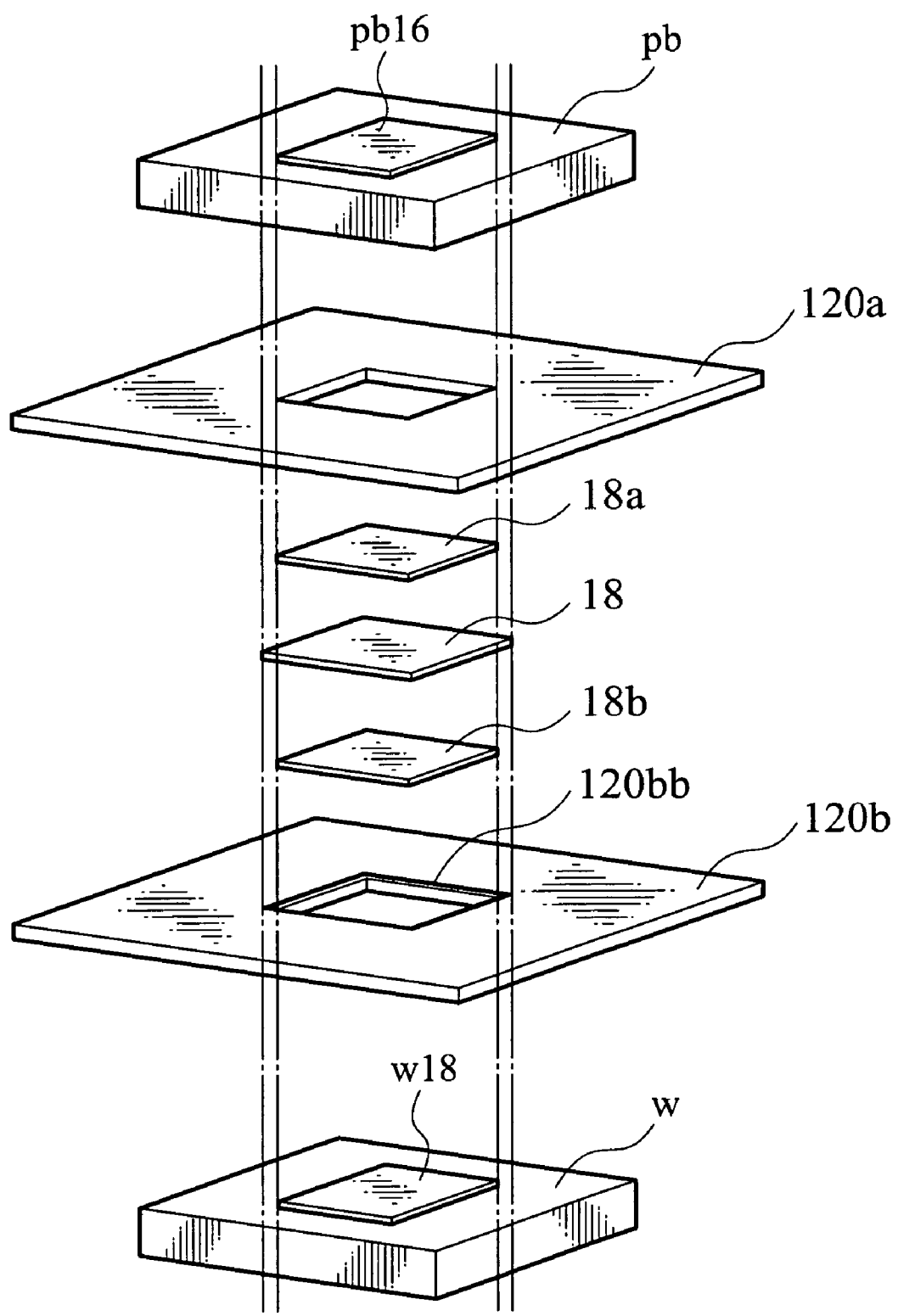
FIG. 16B is an exploded perspective view showing details of a eleventh packaging unit encapsulating a fifth diode.

Then, the eleventh packaging unit associated with the fifth diode 5 of the W-phase upper arm will be explained referring to FIG. 16B. As shown in FIG. 16B, the eleventh packaging unit encompasses the first power distribution plate (P side bus bar) pb, an upper insulation layer 120a an upper thermal buffering layer 18a a bare chip of the fifth diode 18, a lower thermal buffering layer 18b, a lower insulation layer 120b, and the W-phase wiring plate (output bus bar) w. At a top surface of the lower insulation layer 120b of the W-phase upper arm a frame-shaped recess 120bb is provided so that the perimeter of the bare chip (the fifth diode) 18 can be mated in the step, when the bare chip (the fifth diode) 18 is stacked with the lower insulation layer 120b. Similarly, at a bottom surface of the upper insulation layer 120a of the W-phase upper arm, another frame-shaped recess is provided so that the perimeter of the bare chip (the fifth diode) 18 can be mated in the step, when the bare chip (the fifth diode) 18 is stacked with the upper insulation layer 120a.

Figure 16C:
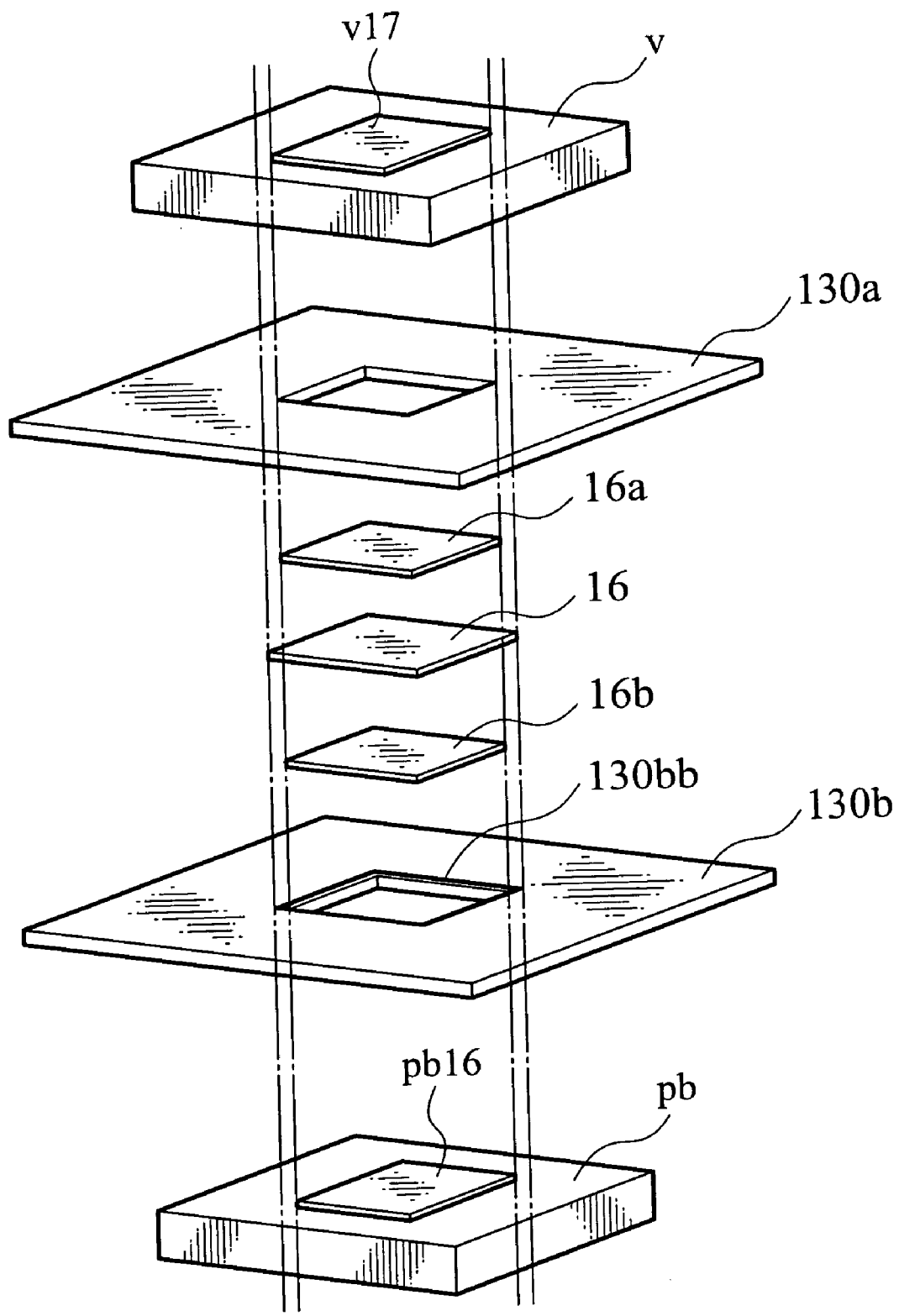
FIG. 16C is an exploded perspective view showing details of a ninth packaging unit encapsulating a third diode.

As shown in FIG. 16C, the ninth packaging unit encompasses the V-phase wiring plate (output bus bar) v, an upper insulation layer 130a an upper thermal buffering layer 16a a bare chip of the third diode 16, a lower thermal buffering layer 16b, a lower insulation layer 130b, and the first power distribution plate (P side bus bar) pb. At a top surface of the lower insulation layer 130b of the V-phase upper arm a frame-shaped recess 130bb is provided so that the perimeter of the bare chip (the third diode) 16 can be mated in the step, when the bare chip (the third diode) 16 is stacked with the lower insulation layer 130b. Similarly, at a bottom surface of the upper insulation layer 130a of the V-phase upper arm, another frame-shaped recess is provided so that the perimeter of the bare chip (the third diode) 16 can be mated in the step, when the bare chip (the third diode) 16 is stacked with the upper insulation layer 130a.

Figure 16D:
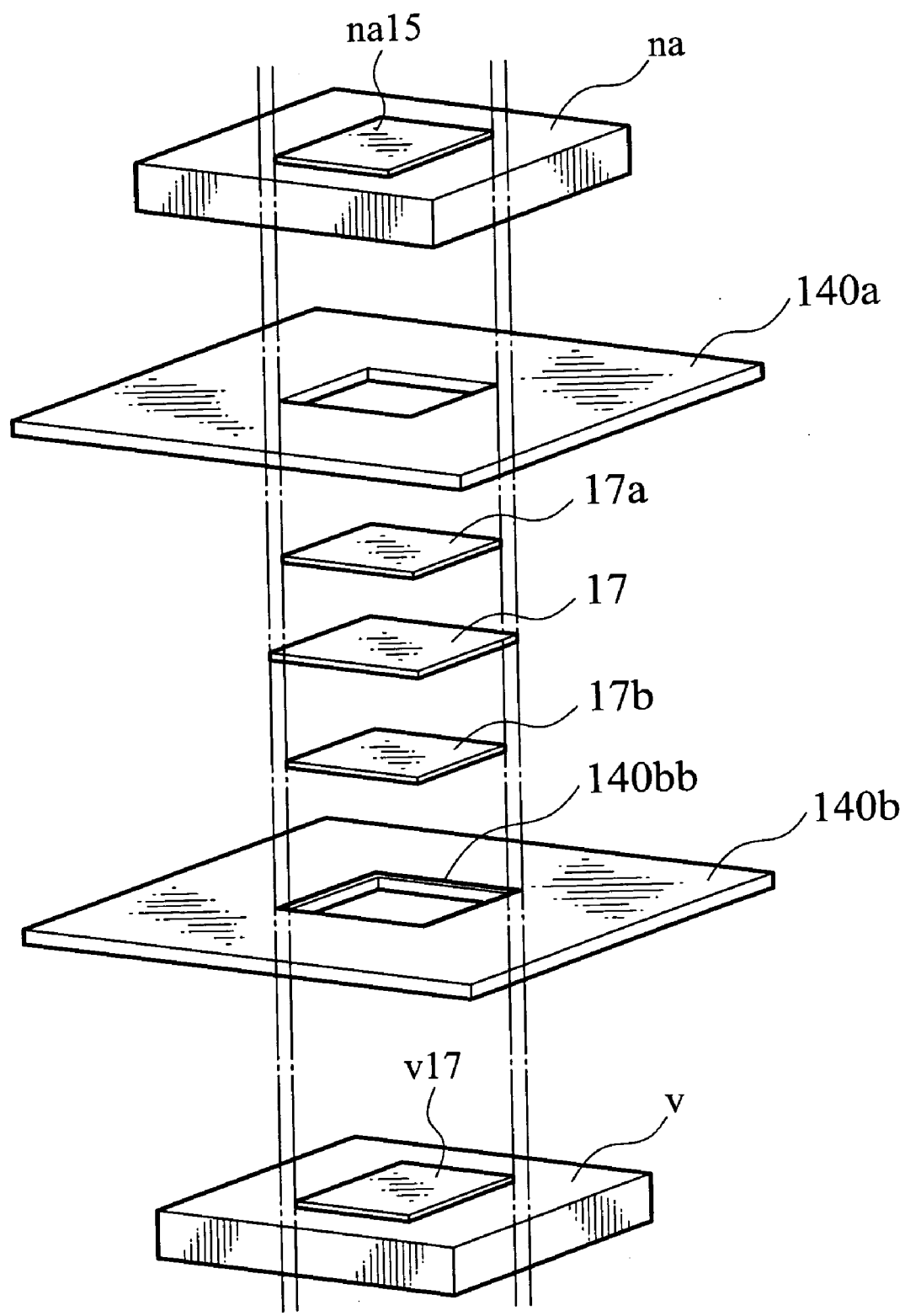
FIG. 16D is an exploded perspective view showing details of a tenth packaging unit encapsulating a fourth diode.

As shown in FIG. 16D, the tenth packaging unit encompasses the second power distribution plate (N side bus bar) na, an upper insulation layer 140a, an upper thermal buffering layer 17a, a bare chip of the fourth diode 17, a lower thermal buffering layer 17b, a lower insulation layer 140b, and the V-phase wiring plate (output bus bar) v. At a top surface of the lower insulation layer 140b of the V-phase lower arm a frame-shaped recess 140bb is provided so that the perimeter of the bare chip (the fourth diode) 17 can be mated in the step, when the bare chip (the fourth diode) 17 is stacked with the lower insulation layer 140b. Similarly, at a bottom surface of the upper insulation layer 140a of the V-phase lower arm, another frame-shaped recess is provided so that the perimeter of the bare chip (the fourth diode) 17 can be mated in the step, when the bare chip (the fourth diode) 17 is stacked with the upper insulation layer 140a.

Figure 16E:
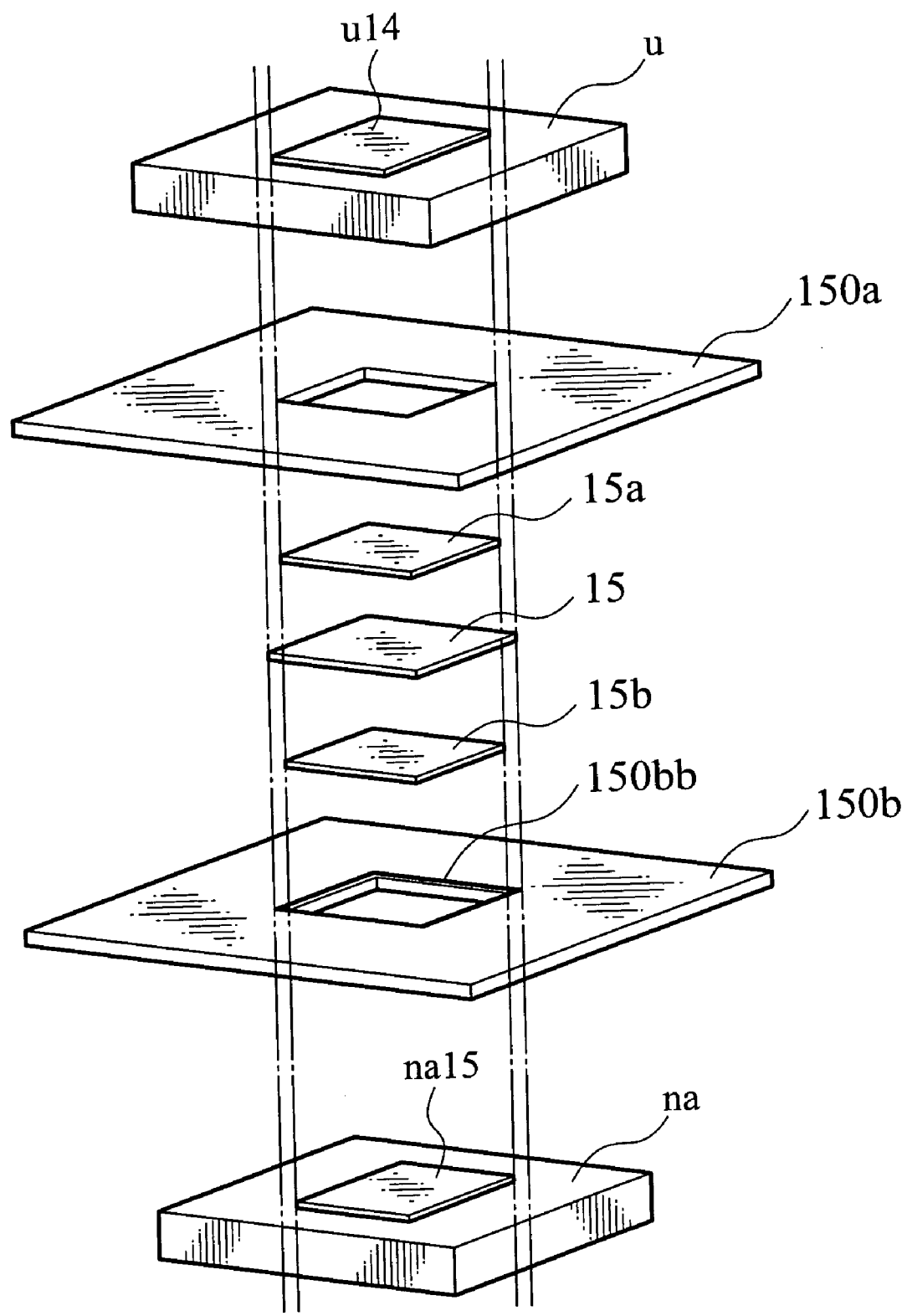
FIG. 16E is an exploded perspective view showing details of a eighth packaging unit encapsulating a second diode.

As shown in FIG. 16E, the eighth packaging unit encompasses the U-phase wiring plate (output bus bar) u, an upper insulation layer 150a an upper thermal buffering layer 15a a bare chip of the second diode 15, a lower thermal buffering layer 15b, a lower insulation layer 150b, and the second power distribution plate (N side bus bar) na. At a top surface of the lower insulation layer 150b of the U-phase lower arm a frame-shaped recess 150bb is provided so that the perimeter of the bare chip (the second diode) 15 can be mated in the step, when the bare chip (the second diode) 15 is stacked with the lower insulation layer 150b. Similarly, at a bottom surface of the upper insulation layer 150a of the U-phase lower arm, another frame-shaped recess is provided so that the perimeter of the bare chip (the second diode) 15 can be mated in the step, when the bare chip (the second diode) 15 is stacked with the upper insulation layer 150a.

Figure 16F:
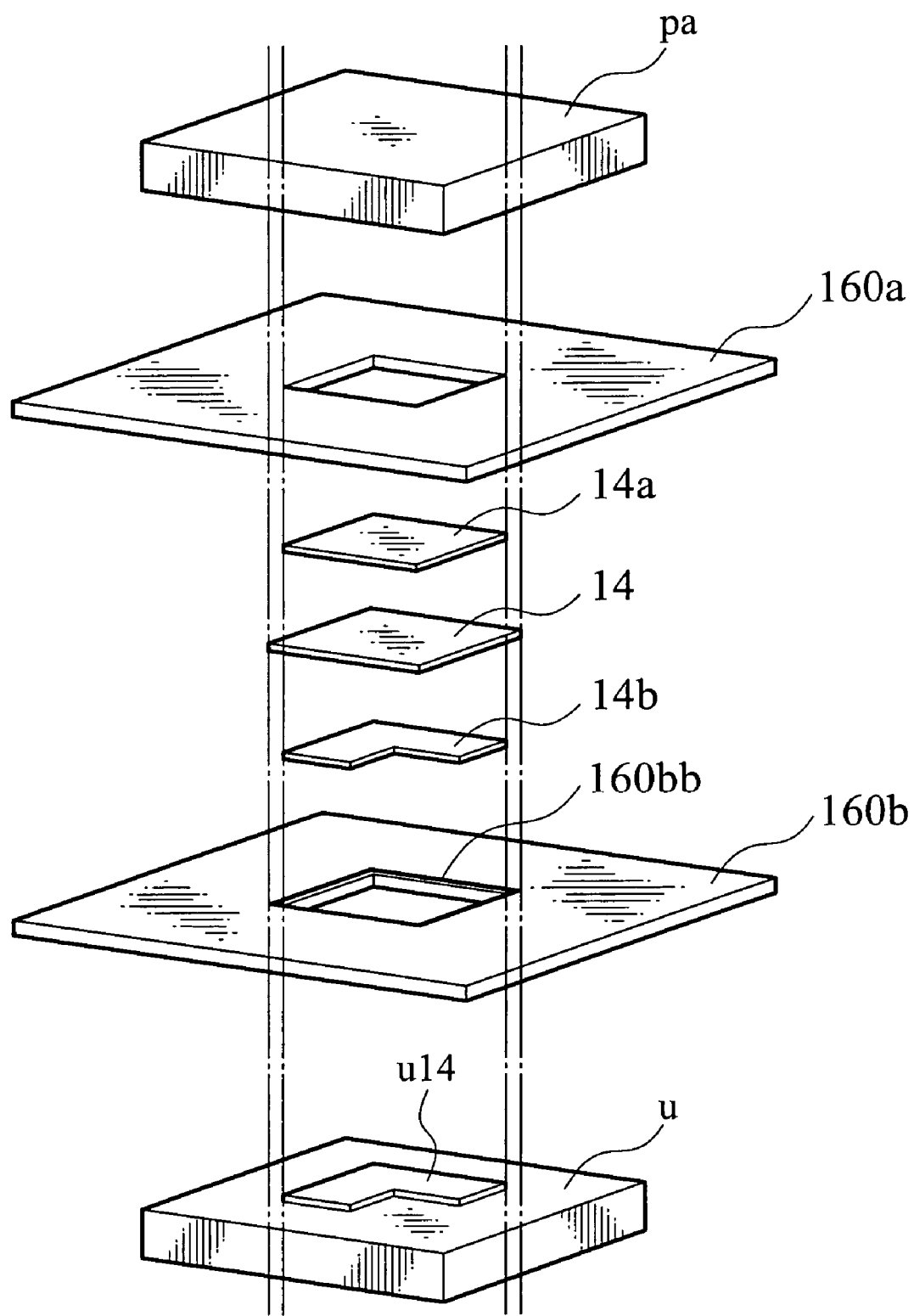
FIG. 16F is an exploded perspective view showing details of a seventh packaging unit encapsulating a first diode.

As shown in FIG. 16F, the seventh packaging unit encompasses the first power distribution plate (P side bus bar) pa an upper insulation layer 160a an upper thermal buffering layer 14a a bare chip of the first diode 14, a lower thermal buffering layer 14b, a lower insulation layer 160b, and the U-phase wiring plate (output bus bar) u. At a top surface of the lower insulation layer 160b of the U-phase upper arm a frame-shaped recess 160bb is provided so that the perimeter of the bare chip (the first diode) 14 can be mated in the step, when the bare chip (the first diode) 14 is stacked with the lower insulation layer 160b. Similarly, at a bottom surface of the upper insulation layer 160a of the U-phase upper arm, another frame-shaped recess is provided so that the perimeter of the bare chip (the first diode) 14 can be mated in the step, when the bare chip (the first diode) 14 is stacked with the upper insulation layer 160a.

Next, an assembling method of the upper and lower arms implementing the one phase circuit in the power stage of the three-phase inverter is explained along with the assembling procedure, referring to the process perspective views shown in FIGS. 17A–17J. The fifth and sixth switching elements 5 and 6 for the upper and lower arms of W-phase (see FIG. 13) are explained as representatives of other switching elements 1 to 4.

Figure 17A:
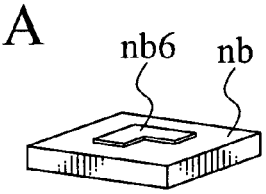
FIGS. 17A–17J are process cross-sectional views showing an assembling method of the stacked semiconductor module according to the fourth embodiment.
Figure 17B:
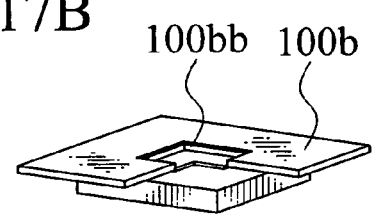

(a) At first, a second power distribution plate (N side bus bar) nb having a protrusion nb6 is prepared as shown in FIG. 17A. Then, on the second power distribution plate (N side bus bar) nb, a lower insulation layer 100b is stacked as shown in FIG. 17B. Because by the protrusion nb6 disposed on the second power distribution plate (N side bus bar) nb, the lower insulation layer 100b is aligned with the second power distribution plate (N side bus bar) nb, positioning of the lower insulation layer 100b is easy. In other words, on the second power distribution plate (N side bus bar) nb, because the protrusion nb6 is provided at the contacting surface scheduled to be connected to the sixth switching element 6 electrically, positioning of the lower insulation layer and 100b in a production assembly process becomes easy, and production costs can be reduced.

Figure 17C:
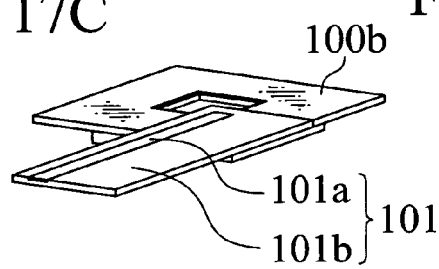
Figure 17D:
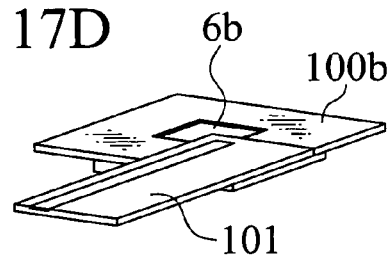

(b) Next, a control electrode slab 101 is stacked on the second power distribution plate (N side bus bar) nb as shown in FIG. 17C. Successively, right above the protrusion nb6, a lower thermal buffering layer 6b is stacked as shown in FIG. 17D. Because, the lower thermal buffering layer 6b is aligned to the second power distribution plate (N side bus bar) nb by the lower insulation layer 100b, positioning of the lower thermal buffering layer 6b becomes easy. A top surface of the lower thermal buffering layer 6b mounted on the protrusion nb6 above the second power distribution plate (N side bus bar) nb and the top surface of the control electrode wiring 101a are set to a same horizontal level so that they can simultaneously connected to respective electrodes of the sixth switching element 6.

Figure 17E:
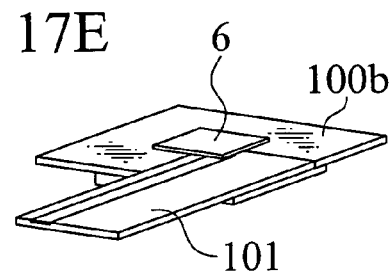

(c) Next, the sixth switching element 6 is mounted on the lower thermal buffering layer 6b so that the bottom electrode serving as the emitter electrode, for example, can mate to the protrusion nb6 disposed on the second power distribution plate (N side bus bar) nb as shown in FIG. 17E. As for the sixth switching element 6, positioning is enabled easily because the sixth switching element 6 is aligned so that the perimeter of the sixth switching element 6 can mate in the recess provided in the lower insulation layer 100b. In the recess of the lower insulation layer 100b, because the electrode region of the sixth switching element 6 is configured to contact with the lower thermal buffering layer 6b, the guard ring portion disposed at the perimeter of the sixth switching element 6 functions normally, and an enough insulation distance between the lower thermal buffering layer 6b and the bottom electrode of the sixth switching element 6 is established and a structure of high reliability is achieved. By changing the geometry of the recess, the dielectric breakdown voltage between the top electrode and the bottom electrode of the sixth switching element 6 can be improved. Because the sixth switching element 6 is assembled using the insulation layer 100b as a guide, alignment of sixth switching element 6 itself and alignment of the thermal buffering layer 6b with second power distribution plate (N side bus bar) nb become easy, and production costs can be reduced.

Figure 17F:
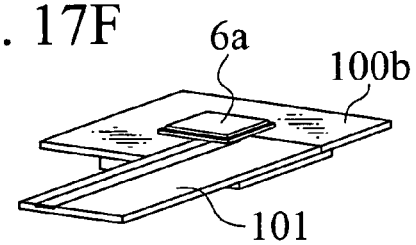
Figure 17G:
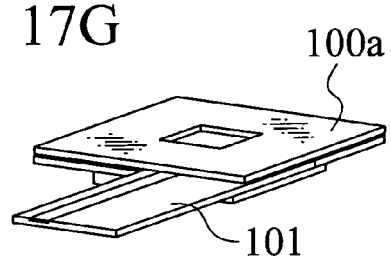
Figure 17H:
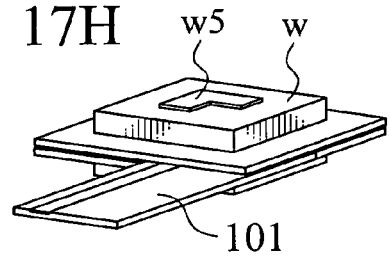

(d) Next, on the top electrode of the sixth switching element 6 serving as a collector electrode, for example, an upper thermal buffering layer 6a is stacked as shown in FIG. 17F. Subsequently, on the upper thermal buffering layer 6a, an upper insulation layer 100a is stacked as shown in FIG. 17G. Subsequently, W-phase wiring plate (output bus bar) w is stacked on the upper insulation layer 100a as shown in FIG. 17H. The recess of the upper and lower insulation layers 100a and 100b positions the sixth switching element 6 and the upper thermal buffering layer 6a, and the upper and lower insulation layers 100a and 100b are positioned beneath a protrusion disposed at the bottom surface of the wiring plate (output bus bar) w. In this way the sixth switching element 6 is completed.

Figure 17I:
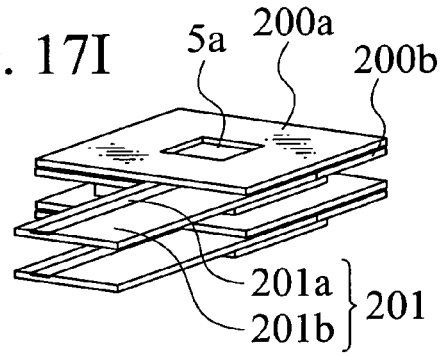
Figure 17J:
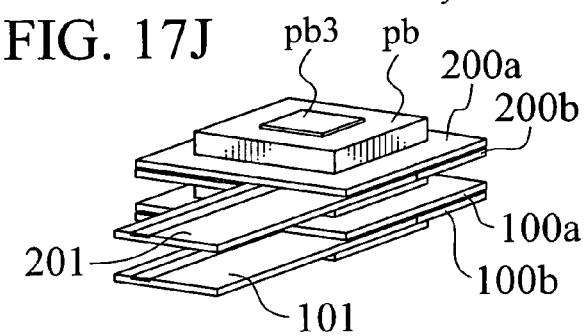

(e) Successively, for the W-phase upper arm, a similar assembling procedure of the W-phase lower arm is applied. Namely, on the wiring plate (output bus bar) w, a lower insulation layer 200b of the upper arm, a control electrode slab 201 of the upper arm having the control electrode 201a and the gate plate 201b, a lower thermal buffering layer 5b of the upper arm, a fifth switching element 5 of the upper arm, an upper thermal buffering layer 5a of the upper arm, and an upper insulation layer 200a of the upper arm are stacked as shown in FIG. 17I. (f) Finally, on the upper insulation layer 200a, a first power distribution plate (P side bus bar) pb serving as an electrode of high potential is stacked as shown in FIG. 17J. Thus, the W-phase implemented by the upper and lower arms with the fifth and sixth switching elements 5 and 6 are established.

In addition, the first power distribution plate (P side bus bar) pb is used common in a V-phase circuit, and on a protrusion pb3 of the first power distribution plate (P side bus bar) pb, a lower thermal buffering layer 300b of a V-phase upper arm is stacked.

Figure 18:
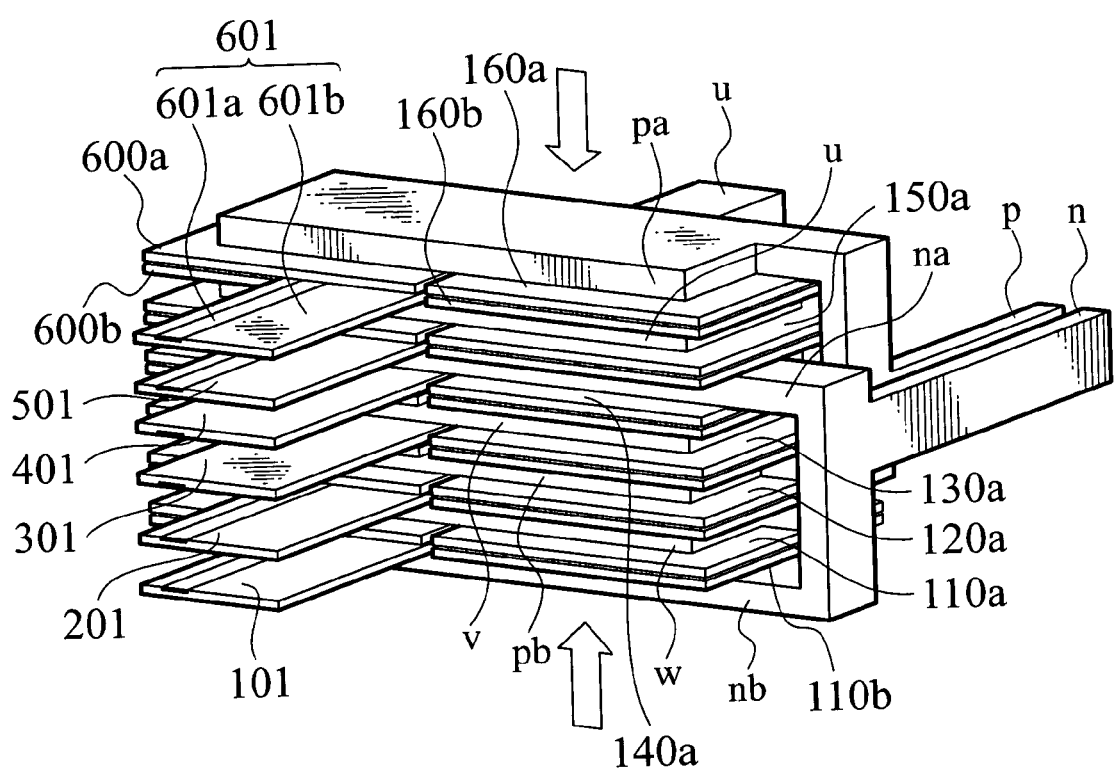
FIG. 18 is a perspective view of the stacked semiconductor module associated with the fourth embodiment.
Figure 19:
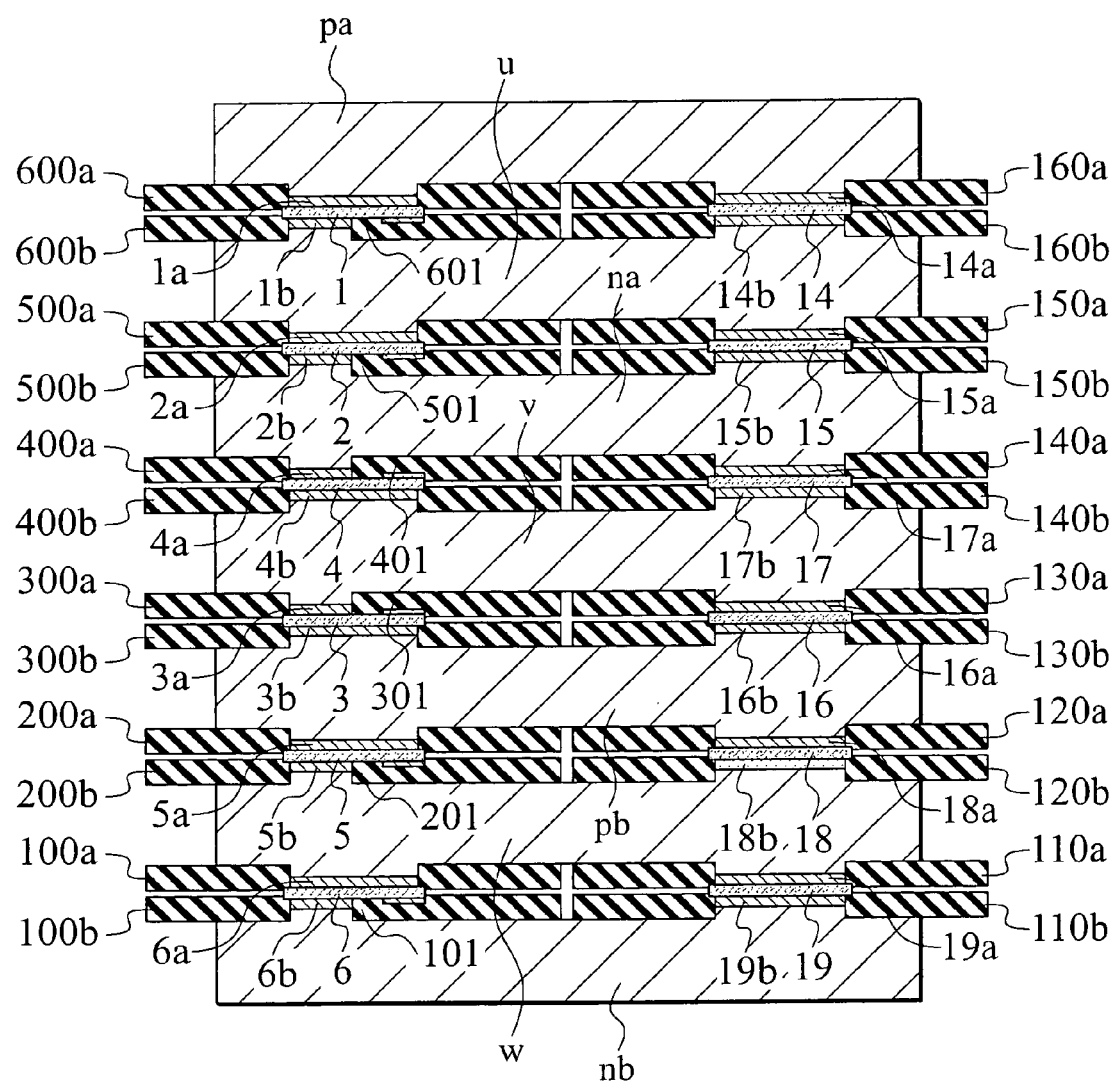
FIG. 19 is a cross-sectional view showing the configuration of the stacked semiconductor module shown in FIG. 18.
Figure 20:
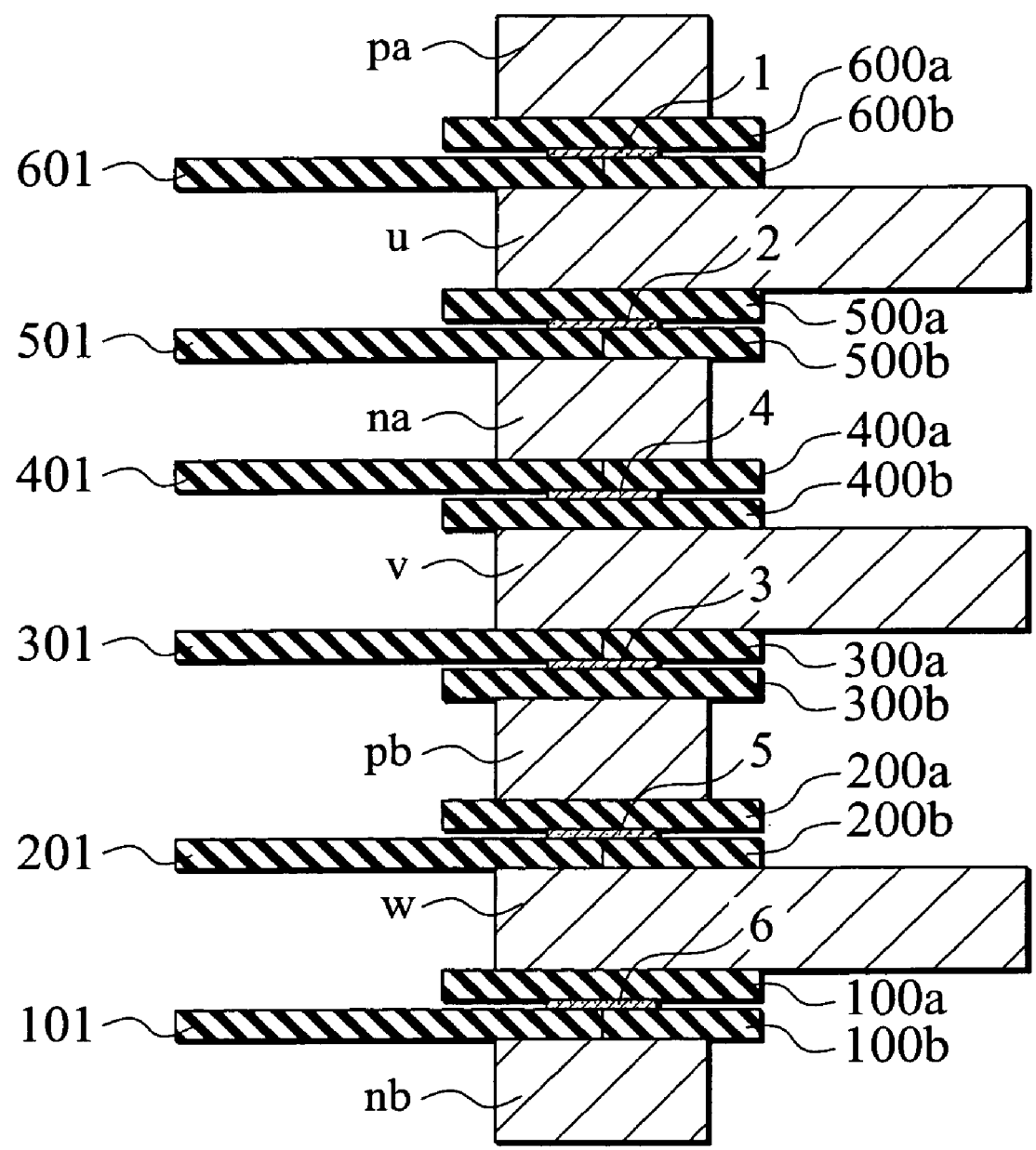
FIG. 20 is another cross-sectional view showing the configuration of the stacked semiconductor module shown in FIG. 18.

Next, a whole configuration of the power stage of the three-phase inverter is explained by a perspective view shown in FIG. 18. FIG. 19 is a cross-sectional view being cut in a plane along the stacked direction and a long side direction of first power distribution plate (P side bus bar) in FIG. 18. FIG. 20 is a cross-sectional view being cut in a plane along the stacked direction and a short side direction of first power distribution plate (P side bus bar) in FIG. 18, the cross-section is cut in a plane along a long side direction of the control electrode slab 101, 201, 301, 401, 501 and 601 in FIG. 18.

Following the assembling process of the W-phase upper and lower arms explained above, in the reverse procedure to the assembling process of the W-phase, on the p side bus bar pb of the W- and V-phases, a V-phase upper arm is stacked so as to assemble an wiring plate (output bus bar) v of the V-phase.

And a V-phase lower arm is stacked on the wiring plate (output bus bar) v of the V-phase.

Further, by assembling a second power distribution plate (N side bus bar) na for V- and U-phases, a U-phase upper and lower arms is constructed following the construction of the V-phase circuit. Namely, along the same assembling procedure of the W-phase circuit, a U-phase lower arm is stacked on the second power distribution plate (N side bus bar) na for V- and U-phases so as to assemble an wiring plate (output bus bar) u of U-phase. And by stacking a U-phase upper arm on the wiring plate (output bus bar) u of U-phase, and by mounting a first power distribution plate (P side bus bar) pa for U-phase, the upper and lower arms of U-phase are constructed, following to the construction of the W-phase circuit and the V-phase circuit. Then the power stage of the three-phase inverter is completed.

For diodes, by making the wiring plates (output bus bars) w, v and u of respective phases, the second power distribution plate (N side bus bar) na and nb, and the first power distribution plate (P side bus bar) pa and pb common with corresponding first to sixth switching elements 1 to 6, respectively, as shown in FIG. 18 and FIG. 19, the first to sixth diodes 14 to 19 are connected in parallel with corresponding first to sixth switching elements 1 to 6. Because the wiring plates (output bus bars) w, v and u of U-phase, V-phase, and W-phase protrude along same direction in parallel with the connection portions of the switching elements or diodes, as shown in FIG. 18 and FIG. 20, if a plug type connection is used, the three-phase inverter can be easily attached to a motor, for example. The wiring plates (output bus bars) w, v and u of U-phase, V-phase, and W-phase protrude in the right- and depth-ward direction of the paper in FIG. 18, and protrude in the right-ward direction in FIG. 20.

The second power distribution plate (N side bus bar) na is common for U-phase and V-phase, and the first power distribution plate (P side bus bar) pb is common for V-phase and W-phase. The first power distribution plates (P side bus bars) pa and pb merge into a first common beam (pa, pb) at right side of the element-stacking column and are mutually connected electrically in the neighborhood of the element-stacking column so that the potentials of the first power distribution plates (P side bus bars) pa and pb become the same. In other words, the first power distribution plate encompasses a first common beam, a first upper branch pa diverged from the first common beam, electrically connected to the first top electrode, and a first lower branch pb diverged from the first common beam, electrically connected to the first upper branch pa configured to extend beneath the second power distribution plate. Similarly, the second power distribution plates (N side bus bars) na and nb merge into a second common beam (na, nb) at right side of the element-stacking column and are mutually connected electrically in the neighborhood of the element-stacking column so that the potentials of the second power distribution plates (N side bus bars) na and nb become same. That is, the second power distribution plate encompasses a second common beam, a second upper branch na diverged from the second common beam, electrically connected to the fourth top electrode, and a second lower branch nb diverged from the second common beam, electrically connected to the second upper branch na configured to extend beneath the first lower branch pb of the first power distribution plate (pa, pb).

As shown in FIG. 18, the first common beam (pa, pb) of the first power distribution plate (P side bus bar) mates to the second common beam (na, nb) of the second power distribution plate (N side bus bar), and they run in parallel and side by side adjacently so that parasitic inductance of the first power distribution plate (P side bus bar) and the second power distribution plate (N side bus bar) nb can be reduced to a minimum value.

Furthermore, in all other planes than the plane from which the wiring plates (output bus bars) w, v and u, the first power distribution plate (P side bus bar) pa, pb and the second power distribution plate (N side bus bar) na, nb protruding, heat radiation can be accomplished, except for the plane from which the control electrode slab 101, 201, 301,401, 501 and 601 are projecting. By this heat removal configuration, the cooling capability improves and miniaturization of the stacked semiconductor module can be achieved.

As shown in FIG. 18, between the first power distribution plate (P side bus bar) pa and the second power distribution plate (N side bus bar) nb, which are disposed at both ends of the three-phase inverter, by applying pressure along the top and bottom directions as shown by arrows, all constituent members are stack-pressed uniformly, therefore the power stage of the three-phase inverter in which variation of contact resistances and heat resistances between switching elements are small is achieved.

Because it is small in size, wire bonding is not required, and circuits for three-phases can be constructed simultaneously, a significant reduction of the number of process stages, and the reduction of production costs can be achieved. By providing hard or soft solders in each of connection portions, after the completion of assembly, or in the middle of assembly, and in a furnace, the hard or soft solders may melt to assemble all or some constituent members so that the power stage of the three-phase inverter can be established. Of course, the process of the press contact can be combined.

Or, insulation resin such as epoxy resin or silicone resin can be filled so as to be rigidified. By means of sealing with the insulation resin, all constituent members can be fixed so as to accomplish the power stage of the three-phase inverter. By molding with insulation resin, the switching elements and diodes can isolated physically and chemically from the outside, and safety performance as the stacked semiconductor module can be improved.

As a feature of such three-phase inverter, the first to sixth switching elements 1 to 6 and the first to sixth diodes 14 to 19 implementing the three-phase circuits of the inverter are stacked along the top and bottom direction, and a structure in which the first to sixth switching elements 1 to 6 and the first to sixth diodes 14 to 19 are connected to corresponding bus bar with flat contact planes is adopted. An area being occupied by switching elements and diodes in a plane direction can be reduced to ⅙ of the earlier configuration, because the area for one arm in a plane direction is required in the forth embodiment, while in the earlier configuration, area for six arms is required in the plane direction.

Furthermore, because first to sixth switching elements 1 to 6 each having the control electrode slab 101, 201, 301, 401, 501 or 601 are stacked, the size of half bridge circuit as a basic circuit unit can be miniaturized. In addition, because of the structure in which the upper and lower diodes are stacked vertically, being paired up with first to sixth switching elements 1 to 6 implementing half bridge circuit, the required set of the upper and lower diodes can be made smaller. Because the diodes 14 to 19 paired up with first to sixth switching elements 1 to 6 implementing half bridges can be stacked simultaneously, the size of a single leg-circuit can be miniaturized.

In all switching elements and diodes, through the thermal buffering layer, the bus bar connected directly to corresponding electrode region of the switching elements or diodes with a large area in a planer geometry so that parasitic inductance between the switching elements and the bus bars or between the diodes and the bus bars can be reduced to a minimal level. Therefore, when the three-phase inverter is operated, spike voltage due to parasitic inductance in a switching transition period can be suppressed. Therefore, for the switching element, the design enabling lower rated drain-source voltage can be enabled and cost reduction is achieved. Then, a snubber circuit for protecting the switching element can be simplified, or can be eliminated so that costs as the whole system can be reduced, and further miniaturization is thus enabled.

In the fourth embodiment, the configuration in which the first to sixth diodes 14 to 19 were connected in parallel with the first to sixth switching elements 1 to 6, respectively, has been explained, but, further switching elements and diodes can be connected in parallel so that the current handling capability can be increased.

OTHER EMBODIMENTS

Various modifications will become possible for those skilled in the art after receiving the teaching of the present disclosure without departing from the scope thereof.

In the above first to fourth embodiments, it was assumed that each of the first to sixth switching elements 1 to 6 is implemented by one semiconductor element, but each of the first to sixth switching elements 1 to 6 can be implemented by plural semiconductor elements connected in parallel so as to construct power modules. The power module implemented by plural semiconductor elements can increase current handling capability of the stacked semiconductor module.

In the above first to fourth embodiments, the configurations in which the first to sixth switching elements 1 to 6 are fixed by press contact architecture, but a stacked structure assembled by soldering can be employed.

The first to sixth switching elements 1 to 6 can be implemented by silicon based power MOSFETs or silicon based IGBT, but other switching elements such as the power MOSFET made of silicon carbide (SiC) having high speed, low loss, and high thermal stability performance can also be employed.

As to the diodes, fast-recovery diodes (FRDs), Line-frequency diodes or Schottky diodes made of silicon can be employed. And, various diodes made of SiC having high speed and low loss performances can also be used for the diode.

In the case that first to sixth switching elements 1 to 6 made of SiC are employed, by adopting the press-stacked packaging assembly, the connection by bonding wire and the assembling process using solder are not required, and as a system of inverter, a stacked semiconductor module having an excellent tolerance to high temperature can be achieved.

Thus, the present invention of course includes various embodiments and modifications and the like which are not detailed above. Therefore, the scope of the present invention will be defined in the following claims.

This application claims benefit of priority under 35 USC 119 based on Japanese Patent Application No. P2002-301565 filed Oct. 16, 2002, and Japanese Patent Application No. P2003-157857 filed Jun. 3, 2003, the entire contents of which are incorporated by reference herein.

What is claimed is:

1. A stacked semiconductor module comprising:
    a first upper switching element having:
        a first semiconductor chip;
            a first top electrode disposed at a top surface of the first semiconductor chip;
            a first bottom electrode disposed at a bottom surface of the first semiconductor chip; and
            a first control electrode configured to control conduction between the first top and first bottom electrodes;
    a first wiring plate disposed beneath the first upper switching element, electrically connected to the first bottom electrode;
    a first control electrode wiring electrically connected to the first control electrode;
    a first power distribution plate electrically connected to the first top electrode;
        a first lower switching element disposed beneath the wiring plate, having:
            a second semiconductor chip;
                a second top electrode disposed at a top surface of the second semiconductor chip, electrically connected to the first wiring plate;
                a second bottom electrode disposed at a bottom surface of the second semiconductor chip; and
                a second control electrode configured to control conduction between the second top and second bottom electrodes;
    a second power distribution plate having a recessed region, electrically connected to the second bottom electrode; and
    a second control electrode wiring electrically connected to the second control electrode in the recessed region.

2. The stacked semiconductor module of claim 1, further comprising:
    a second upper switching element having:
        a third semiconductor chip;
            a third top electrode disposed at a top surface of the third semiconductor chip, electrically connected to the first power distribution plate;
            a third bottom electrode disposed at a bottom surface of the third semiconductor chip; and
            a third control electrode configured to control conduction between the third top and third bottom electrodes;
    a second wiring plate disposed beneath the second upper switching element, electrically connected to the third bottom electrode; and
    a second lower switching element disposed beneath the second wiring plate, having:
        a fourth semiconductor chip;
            a fourth top electrode disposed at a top surface of the fourth semiconductor chip, electrically connected to the second wiring plate;
            a fourth bottom electrode disposed at a bottom surface of the fourth semiconductor chip, electrically connected to the second power distribution plate; and
            a fourth control electrode configured to control conduction between the fourth top and fourth bottom electrodes.

3. The stacked semiconductor module of claim 1, wherein the first power distribution plate comprises:
    a first common beam;
    a first upper branch diverged from the first common beam, electrically connected to the first top electrode; and
    a first lower branch diverged from the first common beam, electrically connected to the first upper branch configured to extend beneath the second power distribution plate.

4. The stacked semiconductor module of claim 3, further comprising:
    a second upper switching element disposed between the second power distribution plate and the first lower branch of the first power distribution plate having:
        a third semiconductor chip;
            a third top electrode disposed at a top surface of the third semiconductor chip;
            a third bottom electrode disposed at a bottom surface of the third semiconductor chip, electrically connected to the first lower branch of the first power distribution plate; and
            a third control electrode configured to control conduction between the third top and third bottom electrodes;

a second wiring plate disposed above the second upper switching element, electrically connected to the third top electrode; and
a second lower switching element disposed between the second wiring plate and the second power distribution plate, having:
a fourth semiconductor chip;
a fourth top electrode disposed at a top surface of the fourth semiconductor chip, electrically connected to the second power distribution plate;
a fourth bottom electrode disposed at a bottom surface of the fourth semiconductor chip, electrically connected to the second wiring plate; and
a fourth control electrode configured to control conduction between the fourth top and fourth bottom electrodes.

5. The stacked semiconductor module of claim 4, wherein the second power distribution plate comprises:
a second common beam running in parallel and adjacently with the first common beam;
a second upper branch diverged from the second common beam, electrically connected to the fourth top electrode; and
a second lower branch diverged from the second common beam, electrically connected to the second upper branch configured to extend beneath the first lower branch of the first power distribution plate.

6. The stacked semiconductor module of claim 1, further comprising:
an upper diode having:
a first diode chip;
a first cathode electrode disposed at a top surface of the first diode chip, electrically connected to the first power distribution plate; and
a first anode electrode disposed at a bottom surface of the first diode chip, electrically connected to the first wiring plate; and
a lower diode disposed beneath the first wiring plate, having:
a second diode chip;
a second cathode electrode disposed at a top surface of the second diode chip, electrically connected to the first wiring plate; and
a second anode electrode disposed at a bottom surface of the second diode chip, electrically connected to the second power distribution plate.

7. The stacked semiconductor module of claim 1, wherein the first control electrode is disposed at the bottom surface of the first semiconductor chip.

8. The stacked semiconductor module of claim 7, wherein the first control electrode wiring is disposed in a recessed region of the first wiring plate.

9. The stacked semiconductor module of claim 1, wherein the first control electrode is disposed at the top surface of the first semiconductor chip.

10. The stacked semiconductor module of claim 9, wherein the first control electrode wiring is disposed in a recessed region of the first power distribution plate.

11. The stacked semiconductor module of claim 1, wherein the second control electrode is disposed at the bottom surface of the second semiconductor chip.

12. A stacked semiconductor module comprising:
a first upper switching element having:
a first semiconductor chip;
a first top electrode disposed at a top surface of the first semiconductor chip;
a first bottom electrode disposed at a bottom surface of the first semiconductor chip; and
a first control electrode configured to control conduction between the first top and first bottom electrodes;
a first wiring plate disposed beneath the first upper switching element electrically connected to the first bottom electrode;
a first power distribution plate electrically connected to the first top electrode;
a first lower switching element disposed beneath the wiring plate, having:
a second semiconductor chip;
a second top electrode disposed at a top surface of the second semiconductor chip, electrically connected to the first wiring plate;
a second bottom electrode disposed at a bottom surface of the second semiconductor chip; and
a second control electrode configured to control conduction between the second top and second bottom electrodes;
a second power distribution plate electrically connected to the second bottom electrode;
a first upper thermal buffering layer disposed between the first power distribution plate and the first top electrode;
a first lower thermal buffering layer disposed between the first bottom electrode and the first wiring plate;
a second upper thermal buffering layer disposed between the first wiring plate and the second top electrode; and
a second lower thermal buffering layer disposed between the second bottom electrode and the second power distribution plate and first top electrode,
wherein the first upper, the first lower, the second upper and second lower thermal buffering layer are respectively made of material having a lower coefficient of thermal expansion than the material implementing the first power distribution plate, the first wiring plate, or the second power distribution plate.

13. The stacked semiconductor module of claim 12, further comprising:
a mechanism configured to press-contact vertically the laminated structure of the first power distribution plate, the first upper thermal buffering layer, the first upper switching element, the first lower thermal buffering layer, the first wiring plate, the second upper thermal buffering layer, the first lower switching element, the a second lower thermal buffering layer and the second power distribution plate.

14. The stacked semiconductor module of claim 12, further comprising:
an upper insulation layer having a window installing the first upper thermal buffering layer, being disposed between the first power distribution plate and the first upper switching element; and
a lower insulation layer having a window installing the first lower thermal buffering layer, being disposed between the first upper switching element and the first wiring plate.

15. The stacked semiconductor module of claim 14, wherein the first upper switching element is positioned by recesses formed at a top surface of the upper insulation layer and at a bottom surface of the lower insulation layer, respectively.

16. The stacked semiconductor module of claim 14, wherein the first power distribution plate has a protrusion protruding toward the first upper switching element so as to mate with a top surface of the first upper thermal buffering layer in a flat plane, and the first wiring plate has a protrusion protruding toward the first upper switching element so as to mate with a bottom surface of the first lower thermal buffering layer in a flat plane.

17. A stacked semiconductor module comprising:
a first branch of a first power distribution plate;
a U-phase upper arm switching element disposed beneath the first branch of the first power distribution plate, having:
  a first semiconductor chip;
  a first top electrode electrically connected to the first branch of the first power distribution plate, disposed at a top surface of the first semiconductor chip;
  a first bottom electrode disposed at a bottom surface of the first semiconductor chip; and
  a first control electrode configured to control conduction between the first top and first bottom electrodes;
a U-phase wiring plate disposed beneath the U-phase upper arm switching element, electrically connected to the first bottom electrode;
a U-phase lower arm switching element disposed beneath the U-phase wiring plate, having:
  a second semiconductor chip;
  a second top electrode disposed at a top surface of the second semiconductor chip, electrically connected to the U-phase wiring plate;
  a second bottom electrode disposed at a bottom surface of the second semiconductor chip, and
  a second control electrode configured to control conduction between the second top and second bottom electrodes;
a first branch of a second power distribution plate electrically connected to the second bottom electrode;
a V-phase lower arm switching element disposed beneath the first branch of the second power distribution plate, having:
  a third semiconductor chip;
  a third top electrode electrically connected to the first branch of the second power distribution plate, disposed at a top surface of the third semiconductor chip;
  a third bottom electrode disposed at a bottom surface of the third semiconductor chip; and
  a third control electrode configured to control conduction between the third top and third bottom electrodes;
a V-phase wiring plate disposed beneath the V-phase lower arm switching element, electrically connected to the third bottom electrode;
a V-phase upper arm switching element disposed beneath the V-phase wiring plate, having:
  a fourth semiconductor chip;
  a fourth top electrode disposed at a top surface of the fourth semiconductor chip, electrically connected to the V-phase wiring plate;
  a fourth bottom electrode disposed at a bottom surface of the fourth semiconductor chip, and
  a fourth control electrode configured to control conduction between the fourth top and fourth bottom electrodes;
a second branch of the first power distribution plate electrically connected to the fourth bottom electrode;
a W-phase upper arm switching element disposed beneath the second branch of the first power distribution plate, having:
  a fifth semiconductor chip;
  a fifth top electrode electrically connected to the second branch of the first power distribution plate, disposed at a top surface of the fifth semiconductor chip;
  a fifth bottom electrode disposed at a bottom surface of the fifth semiconductor chip; and
  a fifth control electrode configured to control conduction between the fifth top and fifth bottom electrodes;
a W-phase wiring plate disposed beneath the W-phase upper arm switching element, electrically connected to the fifth bottom electrode;
a W-phase lower arm switching element disposed beneath the W-phase wiring plate, having:
  a sixth semiconductor chip;
  a sixth top electrode disposed at a top surface of the sixth semiconductor chip, electrically connected to the W-phase wiring plate;
  a sixth bottom electrode disposed at a bottom surface of the sixth semiconductor chip, and
  a sixth control electrode configured to control conduction between the sixth top and sixth bottom electrodes; and
a second branch of the second power distribution plate electrically connected to the sixth bottom electrode.

* * * * *